(12) United States Patent
Yang

(10) Patent No.: US 8,448,876 B2
(45) Date of Patent: May 28, 2013

(54) SEMICONDUCTOR APPLICATION INSTALLATION ADAPTED WITH A TEMPERATURE EQUALIZATION SYSTEM

(76) Inventor: Tai-Her Yang, Dzan-Hwa (TW)

(*) Notice: Subject to any disclaimer, the term of this patent is extended or adjusted under 35 U.S.C. 154(b) by 760 days.

(21) Appl. No.: 12/457,505

(22) Filed: Jun. 12, 2009

(65) Prior Publication Data

US 2010/0314070 A1    Dec. 16, 2010

(51) Int. Cl.
*G05D 23/00* (2006.01)
*F24J 3/08* (2006.01)

(52) U.S. Cl.
USPC ............... 236/1 C; 62/260; 165/45; 165/97; 165/244; 165/247

(58) Field of Classification Search
USPC . 236/1 C; 62/259.2, 260, 235.1, 264; 165/45, 165/97, 104.19, 104.31, 208, 240, 244, 247
See application file for complete search history.

(56) References Cited

U.S. PATENT DOCUMENTS

| | | | | |
|---|---|---|---|---|
| 3,648,767 A * | 3/1972 | Balch | ...................... | 165/104.19 |
| 4,091,863 A * | 5/1978 | Schroder | .................. | 165/104.17 |
| 4,205,718 A * | 6/1980 | Balch | .............................. | 165/45 |
| 4,378,908 A * | 4/1983 | Wood | .............................. | 237/2 B |
| 5,941,238 A * | 8/1999 | Tracy | ............................. | 126/641 |
| 6,298,677 B1* | 10/2001 | Bujak, Jr. | ........................ | 62/158 |
| 2007/0271940 A1* | 11/2007 | Yang | .............................. | 62/260 |

* cited by examiner

*Primary Examiner* — Marc Norman
(74) *Attorney, Agent, or Firm* — Bacon & Thomas, PLLC

(57) ABSTRACT

The primary purpose of the present invention is to provide an fluid circulating installation adapted with a temperature equalization system and fluid transmission duct disposed in a heat carrier existing in solid or liquid state in the nature where presents comparatively larger and more reliable heat carrying capacity. The fluid passes through the solid or gas state semiconductor application installation to regulate the semiconductor application installation for temperature equalization, and flows back to the heat equalization installation disposed in the natural heat carrier of heat for the heat equalization installation providing good heat conduction in the natural heat carrier to provide the operation of temperature equalization regulating function on the backflow of the fluid.

16 Claims, 17 Drawing Sheets

000# SEMICONDUCTOR APPLICATION INSTALLATION ADAPTED WITH A TEMPERATURE EQUALIZATION SYSTEM

BACKGROUND OF THE INVENTION (a) Field of the Invention

The present invention is related to a semiconductor application installation adapted with a temperature equalization system, and more particularly, to one comprised of heat equalizer and fluid transmission duct disposed in a heat carrier existing in solid or liquid state in the nature including stratum, surface of earth, pond, lake, river, desert, iceberg, or ocean where presents comparatively larger and more reliable heat carrying capacity for the heat equalization installation to directly execute the operation of temperature equalization regulating function on the fluid with temperature difference flowing through the solid or gas state semiconductor application installation; or alternatively, an additional relay heat equalizer giving good heat conduction with the active heat equalization installation to provide the operation of temperature equalization regulating function on the fluid with temperature difference flowing through the relay heat equalizer.

(b) Description of the Prior Art

An active temperature equalization device must be provided in conventional solid or gas state semiconductor application installation for maintaining the temperature, cooling or heating, which enhances cost and consumes more energy.

SUMMARY OF THE INVENTION

The primary purpose of the present invention is to provide an fluid circulating installation adapted with a temperature equalization system and fluid transmission duct disposed in a heat carrier existing in solid or liquid state in the nature where presents comparatively larger and more reliable heat carrying capacity. The fluid passes through the solid or gas state semiconductor application installation to regulate the solid or gas state semiconductor application installation for temperature equalization, and flows back to the heat equalization installation disposed in the natural heat carrier of heat for the heat equalization installation providing good heat conduction in the natural heat carrier to provide the operation of temperature equalization regulating function on the backflow of the fluid.

DESCRIPTION OF MAIN COMPONENT SYMBOLS

Figure 1:
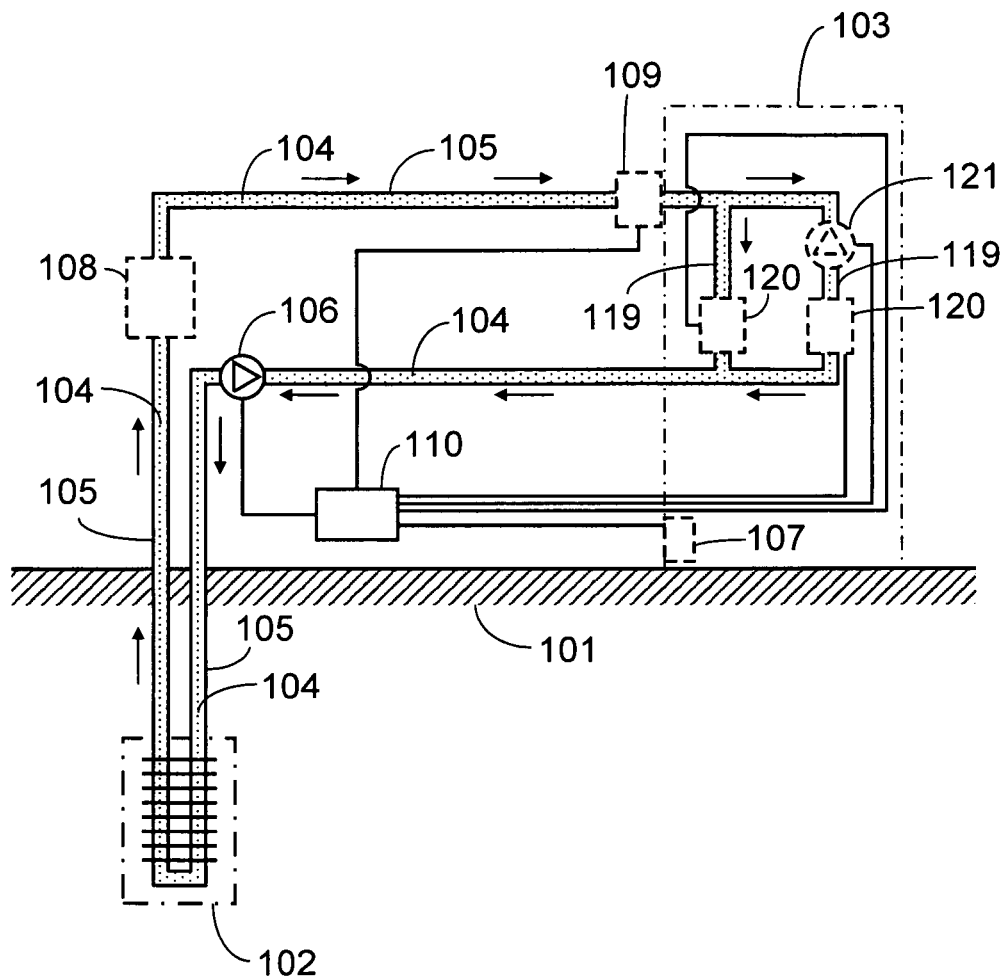
FIG. 1 is a schematic view showing a system of the present invention to directly provide temperature equalization by means of a one-way fluid.

101: natural heat carrier
102: heat equalizer
103: semiconductor application installation
1031: LED with heat dissipation structure at the back or semiconductor application installation with gas state lamp structure
1032: semiconductor application installation comprising photovoltaic generation device with heat dissipation structure at the back
104, 204: fluid
105, 205: fluid transmission duct
106: pump
107: temperature detector device
108: filter
109: auxiliary temperature regulation device
110: control unit
119: liquid bypass duct
120: bypass control valve
121: bypass auxiliary pump
202: relay heat equalizer
206: fluid relay pump 300: Light Emitting Diode (LED) or gas state lamp
310: driver control circuit
400: Optical structure and housing structure of lamp
600: support
601: heat conduction wing
620: Outer duct
700: heat insulation material
800: heat conductor
900: electrical energy storage device
1000: photovoltaic generation device
1005: Electrical adjusting device
1100: auxiliary supporting arm
1200: light source tracking mechanism device

DETAILED DESCRIPTION OF THE PREFERRED EMBODIMENTS

The present invention is related to a semiconductor application installation adapted with a temperature equalization system by means of a heat carrier in the nature. The heat carrier comes from stratum, surface of earth, pond, lake, river in a solid or liquid state that provides comparatively reliable thermal energy; and a heat equalizer with good thermal conduction performance is disposed in the heat carrier to regulate the fluid with temperature difference flowing through the solid or gas state semiconductor application installation for temperature equalization; or the space available in the heat carrier to accommodate fluid or a fluid transmission duct is provided for the fluid to directly contact the heat carrier to function temperature equalization on the fluid passing through.

Based on the environment, benefits and cost considerations, the semiconductor application installation adapted with a temperature equalization system can be comprised of the following system configurations:

(1) A system directly provides temperature equalization function by means of a one-way fluid;
(2) A system indirectly provides temperature equalization function by means of a one-way fluid;
(3) A system directly provides temperature equalization function by means of a two-way fluid; and
(4) A system indirectly provides temperature equalization function by means of a two-way fluid.

As illustrated in FIG. 1 for a schematic view showing a system of the present invention to directly provide temperature equalization by means of a one-way fluid, the system is disposed with one or a plurality of fluid transmission duct (105). A pump (106) is disposed to pump the fluid to pass through a semiconductor application installation (103), the fluid transmission duct (105) and flow back to a heat equalizer (102) disposed in a natural heat carrier (101) wherein the heat carrier comes from stratum, surface of earth, pond, lake, river in a solid or liquid state that provides larger and comparatively reliable thermal energy to complete a path of the fluid. The system is essentially comprised of:

the heat equalizer (102): relates to one made of a material with good heat conduction performance and constructed in a way to provide good heat conduction with the natural heat carrier (101); the heat equalizer (102) is provided with a fluid inlet, a fluid outlet, and an internal fluid passage; or the space in the natural heat carrier (101) allowing the fluid to flow forthwith constitutes a heat equalizer for heat accumulation to replace the heat equalizer (102), made of a material with good heat conduction performance; or both of the heat equalizer (102) and the space in the natural heat carrier (101) are provided at the same time; comprising one or more than one heat equalizers (102) undertaking temperature equalization to the same semiconductor application installation adapted with a temperature equalization system; or one heat equalizer (102) undertaking temperature equalization to one or more than one independently disposed semiconductor application installation adapted with a temperature equalization system; or two or more than two heat equalizers (102) undertaking temperature equalization to two or more than two independently disposed semiconductor application installation adapted with a temperature equalization system.

a semiconductor application installation (103): relates to a semiconductor application installation including semiconductor consists of solid or gas state, or semiconductor connecting to heat dissipating device, or packaged semiconductor, or packaged semiconductor connecting to heat dissipating device; comprising semiconductor connected with heat dissipation device including liquid state, or solid state, or heat dissipation device with thermal duct, the semiconductor application installation given specific functions including all kinds of LED, gas state semiconductor photovoltaic electric lighting, photovoltaic generation device, power transistor, rectifying diode, thyristor, MOSFET, IGBT, GTO, SCR, TRIAC, linear transistor, and all kinds of integrated circuits and memories containing semiconductor, CPU, server, or semiconductor application installations such as LED lighting device, photovoltaic generation device using photovoltaic energy, CPU consists of semiconductor components, large host computer, server, power supply device, electromechanically driven control device, converter device, inverter device, charger device, electrical heat controlling device, electromagnetic controller, and electric lighting driver controlling device made from semiconductor components; the semiconductor application installation stated above with simulation of temperature equalization structure, or above stated semiconductor installation (103) including any of those installations, facilities, or devices is constructed such that it is prepared to execute the subject matter of temperature equalization; or is adapted with a heat sink for cooling or heating to function as the subject matter of temperature equalization;

inside the semiconductor application installation (103), a duct is provided for the fluid (104) to pass through, and a construction is provided at where the structure of the subject matter of temperature equalization attempted by the semiconductor application installation (103) to regulate for temperature equalization between the fluid (104) and the semiconductor application installation (103); or the duct allowing circulation of the fluid (104) is forthwith used to directly provide the regulation for temperature equalization by passing the location of the subject matter of temperature equalization regulating desired. Furthermore, optional items including a bypass duct (119), a bypass control valve (120), and a bypass auxiliary pump (121) can be provided as applicable to introduce the fluid (104) from the heat equalizer (102) disposed in the natural heat carrier (101) to regulate for temperature equalization by having the fluid (104) to flow through the selected individual part of the semiconductor application installation (103), and then the fluid (104) flows back to the heat equalizer (102) to complete the circulation for the operation to provide temperature equalization;

the fluid (104): relates to a gas or a liquid provided to execute the function of heat transmission in the system; the fluid (104) is pumped by the pump (106) to flow through the heat equalizer (102) disposed in the natural heat carrier (101), the fluid transmission duct (105), the optional bypass duct (119) disposed in the semiconductor application installation (103), and flows back through the fluid transmission duct (105) to the heat equalizer (102) to complete the circulation for the operation to provide temperature equalization;

the fluid transmission duct (105): relates to a duct structure provided at where between the heat equalizer (102) and the semiconductor application installation (103) and connected in series with the pump (106) for the fluid (104) to circulate; to facilitate maintenance, an optional device with structure to open or to draw can be provided to the fluid transmission duct (105) as applicable;

the fluid transmission duct (105) stated previously further can be made of material having better heat insulation, or material having at least a layer of heat insulation, or material spread with a layer with heat insulation quality so that when the internal fluid flows through the transmission duct (105) is less likely to be affected by the surrounding temperature;

the pump (106): relates to a fluid pump driven by electric power, mechanical force, manpower, or any other natural force, connected in series with the fluid transmission duct (105), and subject to the control by a control unit (110) to pump the fluid (104); this pumping function can be submitted by the convection effects of the temperature fluctuation of the fluid;

a temperature detector device (107): an optional item related to analog or digital dynamo-electric or solid state electronic device of the prior art disposed in semiconductor application installation (103) to indicate the temperature, or provide signal feedback to the control unit (110) and through operating or stopping control pump (106) for system to operate in programmed temperature range, and auxiliary temperature regulating device (109) disposed in the system and activating auxiliary temperature regulating device (109) when pump (106) operating to reach programmed time and temperature yet still unable to operate in the programmed range;

a filter (108): relates to an optional item provided at the fluid suction inlet or outlet of each device mounted to the fluid circulation loop, or at a selected location in the fluid transmission duct (105) to filter fluid foreign material and prevent the duct from getting plugged and assurance of clean fluid;

an auxiliary temperature regulation device (109): an optional item related to dynamo-electric solid, gas or liquid state temperature regulation device to heat or cool the fluid (104), or a power heating or cooling device comprised of solid state or semiconductor, as subject to the control by the control unit (110) to activate auxiliary temperature regulating device (109) when system temperature drifting programmed range, to be activated to regulate the heating or cooling temperature control to the heating or cooling position of fluid (104) when the temperature in the device floats away from the range set; and the control unit (110): comprised of dynamo-electric or solid state electronic circuit and related software to control fluid pump (106) for pumping one-way continuous or intermittent fluid (104) depending on the temperature detection signal and system temperature setting of the temperature detection device (107), and to control the direction and flow rate of the fluid (104) between the heat equalizer (102) and the semiconductor application installation (103); and to control or stop the pump (106) for the system to operate in the programmed temperature range, and to dispose auxiliary temperature regulating device (109) in the system for the pump (106) to operate and reach programmed time and temperature yet still not operating in the programmed range to activate auxiliary temperature regulating device (109), and to control auxiliary temperature regulating device (109) as auxiliary temperature regulation; and to control system to reduce load or cut off power when system temperature is abnormal;

if the liquid bypass duct (119), bypass control valve (120), and bypass auxiliary pump (121) are optionally provided to the semiconductor application installation (103), the control unit (110) controls the operation of the bypass control valve (120) and the bypass auxiliary pump (121) to pump or stop pumping the fluid (104) in each bypass duct (119), and controls the flow rate or any other related functions; and the control unit (110) could be setup functions and can be or can not be provided as applicable.

Figure 2:
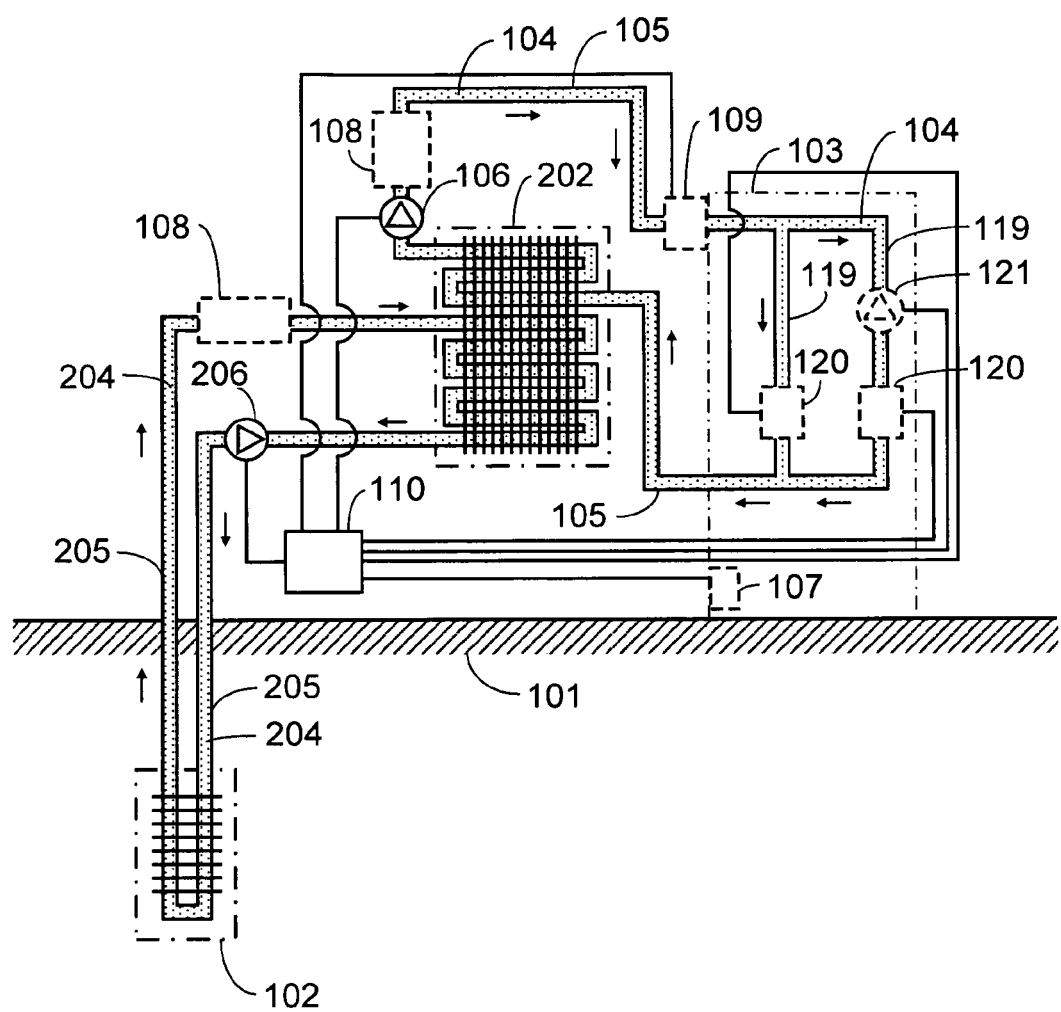
FIG. 2 is a schematic view showing a system of the present invention to indirectly provide temperature equalization by means of a one-way fluid.

FIG. 2 is a schematic view showing a system of the present invention to indirectly provide temperature equalization by means of a one-way fluid. Wherein, an additional relay heat equalizer (202) is provided to indirectly transmit thermal energy for constituting a regulation system of one-way indirect temperature equalization. Other than those items including the heat equalizer (102), the semiconductor application installation (103), the fluid (104), the fluid transmission duct (105), the pump (106), the temperature detection device (107), the filter (108), the control unit (110), and those optional items including auxiliary temperature regulation device (109), the bypass duct (119), the bypass control valve (120), and the bypass auxiliary pump (121) disposed in natural heat carrier (101) for providing equalizing thermal conduction functional operation formed by heat equalizer (102) and natural heat carrier (101) provided by heat equalizer (102) giving good heat conduction disposed in natural heat carrier (101), the indirect regulation system of temperature equalization by means of one-way fluid is further comprised of:

the relay heat equalizer (202) is made of one or more than one kind of material giving good heat accumulation and heat conduction properties, and provided with a first fluid passage including inlet, flowing passage, and outlet for the fluid (104) and a second fluid passage including inlet, flowing passage, and outlet for another fluid (204); both of the fluid (104) and the fluid (204) transmit thermal energy to each other by means of the relay heat equalizer (202);

a fluid transmission duct (205) and a fluid relay pump (206) are provided at where between the heat equalizer (102) and the relay heat equalizer (202) to continuously or intermittently execute one-way pumping the fluid (204) between the heat equalizer (102) and the relay heat equalizer (202) to form a closed loop flow passage for functioning the regulation of temperature equalization between the heat equalizer (102) and the relay heat equalizer (202);

the fluid transmission duct (105) and the pump (106) are disposed between the semiconductor application installation (103) and the relay heat equalizer (202) to continuously or intermittently execute one-way pumping the fluid (104) between the semiconductor application installation (103) and the relay heat equalizer (202) to provide the function of regulating the temperature equalization;

the fluid transmission duct (105): relates to a duct structure for the fluid (104) to pass through, to facilitate maintenance, an optional device with structure to open or to draw can be provided to the fluid transmission duct (105) as applicable;

the fluid transmission duct (105) stated previously further can be made of material having better heat insulation, or material having at least a layer of heat insulation, or material spread with a layer with heat insulation quality so that when the internal fluid flows through the transmission duct (105) is less likely to be affected by the surrounding temperature;

the fluid (104): relates to a gas or liquid giving good heat accumulation and heat conduction properties, and is pumped by the pump (106) for the fluid (104) between the relay heat equalizer (202) and the semiconductor application installation (103) to constitute a flow passage through the fluid transmission duct (105) to provide the regulating function of heat equalization; and the fluid (104) can be or can not be identical with the fluid (204) as applicable;

the fluid transmission duct (205): relates to a duct structure for the fluid (204) to pass through, to facilitate maintenance, an optional device with structure to open or to draw can be provided to the fluid transmission duct (205) as applicable;

the fluid transmission duct (205) stated previously further can be made of material having better heat insulation, or material having at least a layer of heat insulation, or material spread with a layer with heat insulation quality so that when the internal fluid flows through the transmission duct (205) is less likely to be affected by the surrounding temperature;

the fluid (204): relates to a gas or liquid giving good heat accumulation and heat conduction properties, and is pumped by the relay pump (206) for the fluid (204) between the heat equalizer (102) and the relay heat equalizer (202) to constitute a flow passage through the fluid transmission duct (205) to provide the regulating function of heat equalization; and the fluid (204) can be or can not be identical with the fluid (104) as applicable;

the pump (106): relates to a fluid pump driven by electric power or mechanical force to pump the fluid (104); and this pumping function can be submitted by the convection effects of the temperature fluctuation of the fluid;

the relay pump (206): relates to a fluid pump driven by electric power or mechanical force to pump the fluid (204); and this pumping function can be submitted by the convection effects of the temperature fluctuation of the fluid;

the fluid transmission duct (105) and the pump (106) are disposed at where between the semiconductor application installation (103) and the relay heat equalizer (202); and having the pump (106) to pump the fluid (104) flowing between the semiconductor application installation (103) and the relay heat equalizer (202) to provide the function of temperature equalization;

the control unit (110): comprised of dynamo-electric or solid state electronic circuit and related software to control fluid pump (106) for pumping one-way continuous or intermittent fluid (104) depending on the temperature detection signal and system temperature setting of the temperature detection device (107), and to control the direction and flow rate of the fluid (104) between the semiconductor application installation (103) and the relay heat equalizer (202) and the direction and flow rate of the fluid (204) between the relay heat equalizer (202) and the heat equalizer (102); and control the pump (106) to pump the fluid (104) or control the relay pump (206) to pump the fluid (204) for one-way continuous or intermittent pumping, and to control or stop the pump (106) for the system to operate in the programmed temperature range, and to dispose auxiliary temperature regulating device (109) in the system for the pump (106) to operate and reach programmed time and temperature yet still not operating in the programmed range to activate auxiliary temperature regulating device (109), and to control auxiliary temperature regulating device (109) as auxiliary temperature regulation; and to control system to reduce load or cut off power when system temperature is abnormal; and the control operation of the control unit (110) includes:

the pump (106) subject to the control by the control unit (110) executes one-way continuous or intermittent pumping to pump the fluid (104) between the semiconductor application installation (103) and the relay heat equalizer (202) for constituting the control and regulation of one-way temperature equalization; and the relay pump (206) subject to the control by the control unit (110) executes one-way continuous or intermittent pumping to pump the fluid (204) between the heat equalizer (102) and the relay heat equalizer (202) for constituting the control and regulation of one-way temperature equalization;

if the bypass duct (119), bypass control valve (120), and bypass auxiliary pump (121) are optionally provided to the semiconductor application installation (103), the control unit (110) controls the operation of the bypass control valve (120) and the bypass auxiliary pump (121) to pump or stop pumping the fluid (104) in each bypass duct (119), and controls fluid rate or any other related functions; and the control unit (110) could be setup functions and can be or can not be provided as applicable.

Figure 3:
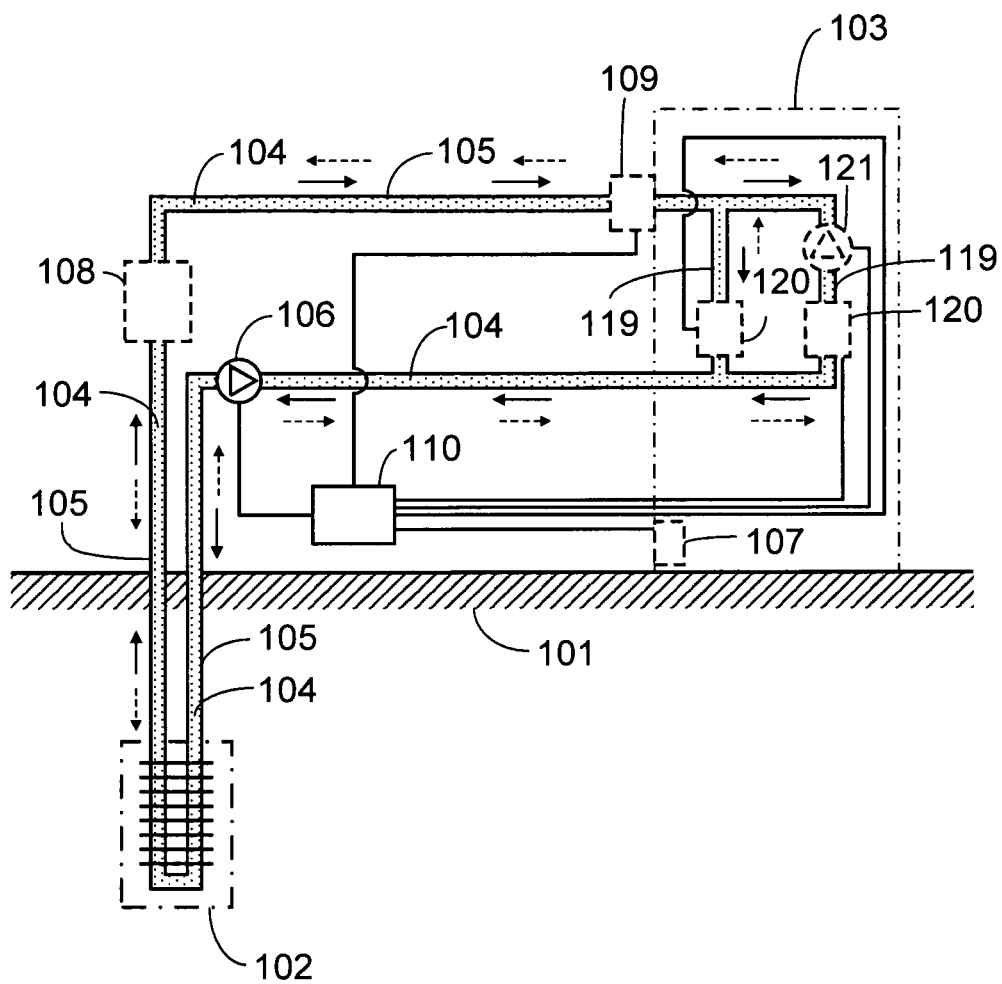
FIG. 3 is a schematic view showing a system of the present invention to directly provide temperature equalization by means of a two-way fluid.

FIG. 3 is a schematic view showing a system of the present invention to directly provide temperature equalization by means of a two-way fluid for providing equalizing thermal conduction functional operation formed by heat equalizer (102) and natural heat carrier (101) for providing the installation of good heat conduction heat equalizer (102) in the natural heat carrier (101) consists of solid state or liquid state natural heat carrier including stratum, surface of earth, pond, lake, river, desert, iceberg, or ocean where presents comparatively larger and more reliable heat carrying capacity. The system illustrated in FIG. 3 is essentially comprised of:

the heat equalizer (102): relates to one made of a material with good heat conduction performance and constructed in a way to provide good heat conduction with the natural heat carrier (101); the heat equalizer (102) is provided with a fluid inlet, a fluid outlet, and an internal fluid passage; or the space in the natural heat carrier (101) allowing the fluid to flow forthwith constitutes a heat carrier for heat accumulation to replace the heat equalizer (102), made of a material with good heat conduction performance; or both of the heat equalizer (102) and the space in the natural heat carrier (101) are provided at the same time; comprising one or more than one heat equalizers (102) undertaking temperature equalization to the same semiconductor application installation adapted with a temperature equalization system; or one heat equalizer (102) undertaking temperature equalization to one or more than one independently disposed semiconductor application installation adapted with a temperature equalization system; or two or more than two heat equalizers (102) undertaking temperature equalization to two or more than two independently disposed semiconductor application installation adapted with a temperature equalization system.

a semiconductor application installation (103): relates to a semiconductor application installation including semiconductor consists of solid or gas state, or semiconductor connecting to heat dissipating device, or packaged semiconductor, or packaged semiconductor connecting to heat dissipating device; comprising semiconductor connected with heat dissipation device including liquid state, or solid state, or heat dissipation device with thermal duct, the semiconductor application installation given specific functions including all kinds of LED, gas state semiconductor photovoltaic electric lighting, photovoltaic generation device, power transistor, rectifying diode, thyristor, MOSFET, IGBT, GTO, SCR, TRIAC, linear transistor, and all kinds of integrated circuits and memories containing semiconductor, CPU, server, or semiconductor application installations such as LED lighting device, photovoltaic generation device using photovoltaic energy, CPU consists of semiconductor components, large host computer, server, power supply device, electromechanically driven control device, converter device, inverter device, charger device, electrical heat controlling device, electromagnetic controller, and electric lighting driver controlling device made from semiconductor components; the semiconductor application installation stated above with simulation of temperature equalization structure, or above stated semiconductor installation (103) including any of those installations, facilities, or devices is constructed such that it is prepared to execute the subject matter of temperature equalization; or is adapted with a heat sink for cooling or heating to function as the subject matter of temperature equalization;

the fluid (104): relates to a gas or a liquid provided to execute the function of heat transmission in the system; the fluid (104) is pumped by the pump (106) to flow through the heat equalizer (102) disposed in the natural heat carrier (101), the fluid transmission duct (105), the optional bypass duct (119) disposed in the semiconductor application installation (103), and flow back through the fluid transmission duct (105) to the heat equalizer (102) to complete the circulation for the operation to provide temperature equalization;

the fluid transmission duct (105): relates a duct structure provided at where between the heat equalizer (102) and the semiconductor application installation (103) and connected in series with the pump (106) for the fluid (104) to circulate; to facilitate maintenance, an optional device with structure to open or to draw can be provided to the fluid transmission duct (105) as applicable;

the fluid transmission duct (105) stated previously further can be made of material having better heat insulation, or material having at least a layer of heat insulation, or material spread with a layer with heat insulation quality so that when the internal fluid flows through the transmission duct (105) is less likely to be affected by the surrounding temperature;

the pump (106): relates to a fluid pump driven by electric power, mechanical force, manpower, or any other natural force, connected in series with the fluid transmission duct (105), and subject to the control by a control unit (110) to pump the fluid (104); this pumping function can be submitted by the convection effects of the temperature fluctuation of the fluid;

a temperature detector device (107): an optional item related to analog or digital dynamo-electric or solid state electronic device of the prior art disposed in semiconductor application installation (103) to indicate the temperature, or provide signal feedback to the control unit (110) and through operating or stopping control pump (106) for system to operate in programmed temperature range, and auxiliary temperature regulating device (109) disposed in the system and activating auxiliary temperature regulating device (109) when pump (106) operating to reach programmed time and temperature yet still unable to operate in the programmed range;

a filter (108): relates to an optional item provided at the fluid suction inlet or outlet of each device mounted to the fluid circulation loop, or at a selected location in the fluid transmission duct (105) to filter fluid foreign material and prevent the duct from getting plugged and assurance of clean fluid;

an auxiliary temperature regulation device (109): an optional item related to dynamo-electric solid, gas or liquid state temperature regulation device to heat or cool the fluid (104), or a power heating or cooling device comprised of solid state or semiconductor, as subject to the control by the control unit (110) to activate auxiliary temperature regulating device (109) when system temperature drifting programmed range, to be activated to regulate the heating or cooling temperature control to the heating or cooling position of fluid (104) when the temperature in the device floats away from the range set; and the control unit (110): comprised of dynamo-electric or solid state electronic circuit and related software to control fluid pump (106) for pumping one-way continuous or intermittent fluid (104) depending on the temperature detection signal and system temperature setting of the temperature detection device (107), and to control the direction and flow rate of the fluid (104) between the heat equalizer (102) and the semiconductor application installation (103); and to control the pump (106) to pump the fluid (104); and to control or stop the pump (106) for the system to operate in the programmed temperature range, and to dispose auxiliary temperature regulating device (109) in the system for the pump (106) to operate and reach programmed time and temperature yet still not operating in the programmed range to activate auxiliary temperature regulating device (109), and to control auxiliary temperature regulating device (109) as auxiliary temperature regulation; and to control system to reduce load or cut off power when system temperature is abnormal for executing periodically positive and negative exchange of the flowing direction of the fluid (104); the operation methods include continuous pumping and intermittent pumping; and control the following operations:

the pump (106) subject to the control by the control unit (110) periodically pumps the fluid (104) in both positive and negative directions for the fluid (104) flowing through the heat equalizer (102), the fluid transmission duct (105) and the interior of the semiconductor application installation (103) to execute periodical exchange of the flowing direction; and for the fluid (104) passing through the heat equalizer (102) and the inlet and outlet of the semiconductor application installation (103) to provide better results of temperature equalization due to periodical exchange of the flowing direction, thus to constitute two-way regulation and control of temperature equalization; if the liquid bypass duct (119), bypass control valve (120), and bypass auxiliary pump (121) are optionally provided to the semiconductor application installation (103), the control unit (110) controls the bypass control valve (120) and the bypass auxiliary pump (121) to pump or stop pumping the fluid (104) in each bypass duct (119), and controls the flow rate or any other related functions; and the control unit (110) could be setup functions and can be or can not be provided as applicable.

Figure 4:
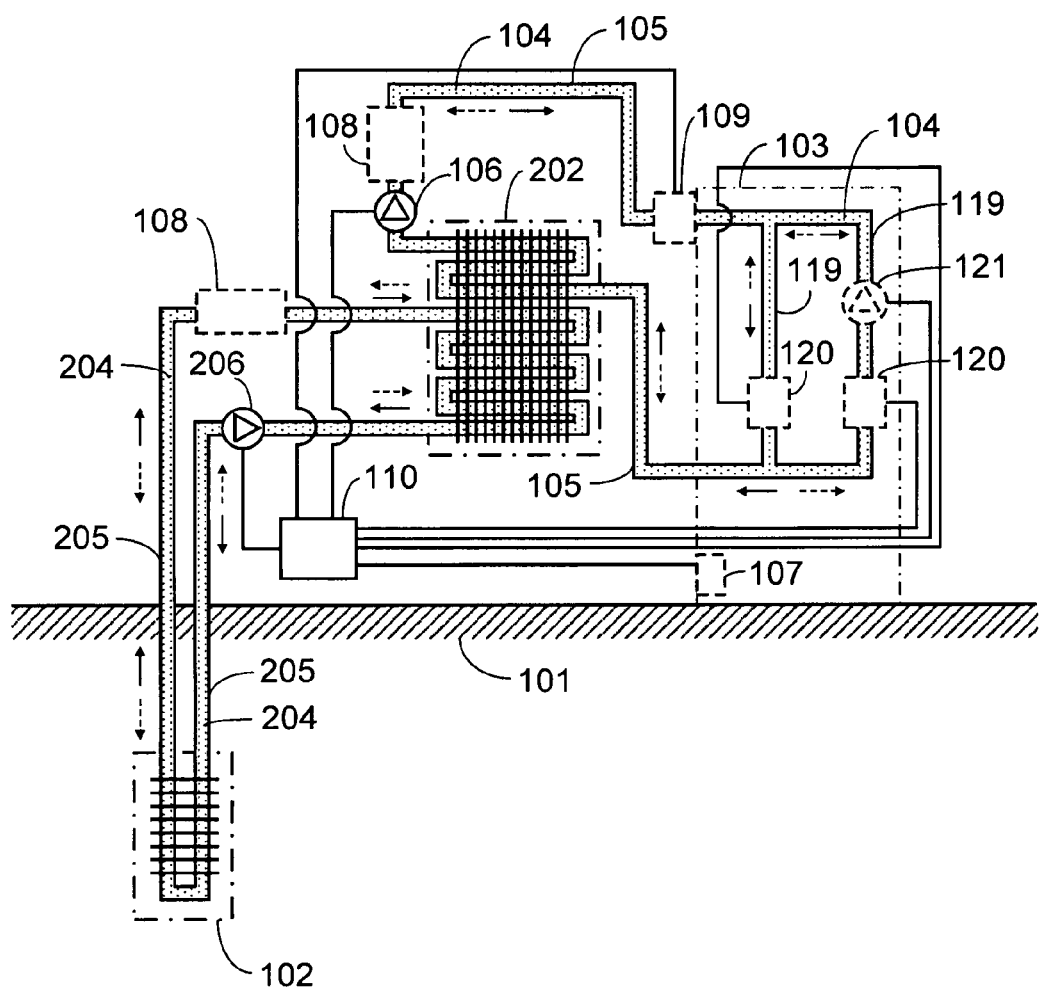
FIG. 4 is a schematic view showing a system of the present invention to indirectly provide temperature equalization by means of a two-way fluid.

FIG. 4 is a schematic view showing a system of the present invention to indirectly provide temperature equalization by means of a two-way fluid. Wherein, the additional relay heat equalizer (202) is provided to indirectly transmit thermal energy for constituting a two-way indirect regulation system of temperature equalization. Other than those items including the natural heat carrier (101), the heat equalizer (102), the semiconductor application installation (103), the fluid (104), the fluid transmission duct (105), the pump (106), the temperature detection device (107), the filter (108), the control unit (110), and those optional items including the auxiliary temperature regulation device (109), the bypass duct (119), the bypass control valve (120), and the bypass auxiliary pump (121), for providing equalizing thermal conduction functional operation formed by heat equalizer (102) and natural heat carrier (101) for providing the installation of good heat conduction heat equalizer (102) in the natural heat carrier (101) consists of solid state or liquid state natural heat carrier including stratum, surface of earth, pond, lake, river, desert, iceberg, or ocean where presents comparatively larger and more reliable heat carrying capacity. This system indirectly executing regulation of temperature equalization by means of the two-way fluid further includes:

the relay heat equalizer (202) is made of one or more than one kind of material giving good heat accumulation and heat conduction properties, and provided with a first fluid passage including inlet, flowing passage, and outlet for the fluid (104) and a second fluid passage including inlet, flowing passage, and outlet for another fluid (204); both of the fluid (104) and the fluid (204) transmit thermal energy to each other by means of the relay heat equalizer (202);

the fluid transmission duct (205) and a fluid relay pump (206) are provided at where between the heat equalizer (102) and the relay heat equalizer (202) to continuously or intermittently execute periodically positive and negative pumping the fluid (204) between the heat equalizer (102) and the relay heat equalizer (202) to form a closed loop flow passage for functioning the regulation of temperature equalization between the heat equalizer (102) and the relay heat equalizer (202);

the fluid transmission duct (105) and the pump (106) are disposed between the semiconductor application installation (103) and the relay heat equalizer (202) to continuously or intermittently execute periodically positive and negative pumping of the fluid (104) between the semiconductor application installation (103) and the relay heat equalizer (202) to provide the function of regulating the temperature equalization;

the fluid transmission duct (105): relates to a duct structure provided for the fluid (104) to circulate; to facilitate maintenance, an optional device with structure to open or to draw can be provided to the fluid transmission duct (105) as applicable;

the fluid transmission duct (105) stated previously further can be made of material having better heat insulation, or material having at least a layer of heat insulation, or material spread with a layer with heat insulation quality so that when the internal fluid flows through the transmission duct (105) is less likely to be affected by the surrounding temperature;

the fluid (104): relates to a gas or liquid giving good heat accumulation and heat conduction properties, and is pumped by the pump (106) for the fluid (104) between the relay heat equalizer (202) and the semiconductor application installation (103) to constitute a flow passage through the fluid transmission duct (105) to provide the regulating function of heat equalization; and the fluid (104) can be or can not be identical with the fluid (204) as applicable;

the fluid transmission duct (205): relates to a duct structure for the fluid (204) to pass through, to facilitate maintenance, an optional device with structure to open or to draw can be provided to the fluid transmission duct (205) as applicable;

the fluid transmission duct (205) stated previously further can be made of material having better heat insulation, or material having at least a layer of heat insulation, or material spread with a layer with heat insulation quality so that when the internal fluid flows through the transmission duct (205) is less likely to be affected by the surrounding temperature;

the fluid (204): relates to a gas or liquid giving good heat accumulation and heat conduction properties, and is pumped by the relay pump (206) for the fluid (204) between the heat equalizer (102) and the relay heat equalizer (202) to constitute a flow passage through the fluid transmission duct (205) to provide the regulating function of heat equalization; and the fluid (204) can be or can not be identical with the fluid (104) as applicable;

the pump (106): relates to a fluid pump driven by electric power, mechanical force, manpower, or any other natural force, connected in series with the fluid transmission duct (105), and subject to the control by a control unit (110) to pump the fluid (104); this pumping function can be submitted by the convection effects of the temperature fluctuation of the fluid;

the relay pump (206): relates to a fluid pump driven by electric power or mechanical force to pump the fluid (204); and this pumping function can be submitted by the convection effects of the temperature fluctuation of the fluid;

the control unit (110): comprised of dynamo-electric or solid state electronic circuit and related software to control fluid pump (106) for pumping one-way continuous or intermittent fluid (104) depending on the temperature detection signal and system temperature setting of the temperature detection device (107), and to control the direction and flow rate of the fluid (104) between the semiconductor application installation (103) and the relay heat equalizer (202) and the flowing direction and flow rate of the fluid (204) between the relay heat equalizer (202) and the heat equalizer (102); and to control the pump (106) to pump the fluid (104) or to control the relay pump (206) to pump the fluid (204) for executing periodically positive and negative exchange of the flowing direction of the fluid (104) or the flowing direction of the fluid (204); the operation methods include continuous pumping and intermittent pumping, and to control or stop the pump (106) for the system to operate in the programmed temperature range, and to dispose auxiliary temperature regulating device (109) in the system for the pump (106) to operate and reach programmed time and temperature yet still not operating in the programmed range to activate auxiliary temperature regulating device (109), and to control auxiliary temperature regulating device (109) as auxiliary temperature regulation; and to control system to reduce load or cut off power when system temperature is abnormal; and control the following operations:

the pump (106) subject to the control by the control unit (110) periodically pumps the fluid (104) in both positive and negative directions for the fluid (104) flowing through the relay heat equalizer (202), the fluid transmission duct (105) and the interior of the semiconductor application installation (103) to execute periodical exchange of the flowing direction; and for the fluid (104) passing through the relay heat equalizer (202), and the inlet and outlet of the semiconductor application installation (103) to provide better results of temperature equalization due to periodical exchange of the flowing direction, thus to constitute two-way regulation and control of temperature equalization; and the relay pump (206) subject to the control by the control unit (110) periodically pumps the fluid (204) in both positive and negative directions for the fluid (204) flowing through the heat equalizer (102), the fluid transmission duct (205) and the interior of relay heat equalizer (202) to execute periodical exchange of the flowing direction; and for the fluid (204) passing through the relay heat equalizer (202) and the inlet and outlet of the heat equalizer (102) to provide better results of temperature equalization due to periodical exchange of the flowing direction, thus to constitute two-way regulation and control of temperature equalization;

if the bypass duct (119), by pass control valve (120), and bypass auxiliary pump (121) are optionally provided to the semiconductor application installation (103), the control unit (110) controls the operation of the bypass control valve (120) and the bypass auxiliary pump (121) to pump or stop pumping the fluid (104) in each bypass duct (119), and controls the flow rate or any other related functions; and the control unit (110) could be setup functions and can be or can not be provided as applicable.

For the system illustrated in FIG. 1 showing the operation of heat equalization between the heat equalizer (102) and the semiconductor application installation (103), one or a plurality of fluid transmission duct (105) and one or a plurality of the pump (106) are disposed at where between the heat equalizer (102) and the semiconductor application installation (103) to constitute a closed loop of flow passage; and having the pump (106) to pump the fluid (104) giving good heat conduction performance to execute one-way continuous or intermittent pumping or control and regulate the pumped flow rate of the fluid (104) to provide the function of temperature equalization between the heat equalizer (102) and the semiconductor application installation (103).

The operation of heat equalization between the heat equalizer (102) and the semiconductor application installation (103) of the system as illustrated in FIG. 3 is achieved by having provided the fluid transmission duct (105) that admits the flow of the fluid (104) and the pump (106), and having the pump (106) to pump the fluid (104) to execute continuous or intermittent pumping in a flowing direction of periodical exchange thus to equalize the temperature difference between the heat equalizer (102) and the semiconductor application installation (103).

The system illustrated in FIG. 1 and FIG. 3 can directly have a heat pipe giving good heat conduction of the prior art provided at where between the heat equalizer (102) and the semiconductor application installation (103) to replace the fluid transmission duct (105), or replace the optional bypass duct (119) to provide the function of temperature equalization.

In the operation method of heat equalization between the heat equalizer (102) and the relay heat equalizer (202) of the system as illustrated in FIG. 2, one or a plurality of fluid transmission duct (205) and one or a plurality of the relay pump (206) are disposed at where between the heat equalizer (102) and the relay heat equalizer (202) to constitute a closed loop of flow passage; and having the relay pump (206) to pump the fluid (204) giving good heat conduction performance to execute one-way continuous or intermittent pumping or control and regulate the pumped flow rate of the fluid (204) to provide the function of temperature equalization between the heat equalizer (102) and the relay heat equalizer (202).

The operation of heat equalization between the relay heat equalizer (202) and the semiconductor application installation (103) of the system as illustrated in FIG. 2 is achieved by having provided one of a plurality of the fluid transmission duct (105) and one of a plurality of the pump (106) deposed at where between the relay heat equalizer (202) and the semiconductor application installation (103) to constitute a closed loop of flow passage; and having the pump (106) to pump the fluid (104) giving good heat conduction performance to execute one-way continuous or intermittent pumping or to control and regulate the pumped flow rate of the fluid (104), thus to equalize the temperature difference between the relay heat equalizer (202) and the semiconductor application installation (103).

In the operation method of heat equalization between the heat equalizer (102) and the relay heat equalizer (202) of the system as illustrated in FIG. 4, the fluid transmission duct (205) that admits the flow of the fluid (204) and the relay pump (206) are disposed at where between one or a plurality of relay heat equalizer (202) and one or a plurality of heat equalizer (102); and having the relay pump (206) to pump the fluid (204) giving good heat conduction performance to execute continuous or intermittent pumping in a flowing direction of periodical exchange to provide the function of temperature equalization between the heat equalizer (102) and the relay heat equalizer (202).

The operation of heat equalization between the relay heat equalizer (202) and the semiconductor application installation (103) of the system as illustrated in FIG. 4 is achieved by having provided the fluid transmission duct (105) that admits the flow of the fluid (104) and the pump (106) at where between the relay heat equalizer (202) and the semiconductor application installation (103), and having the pump (106) to pump the fluid (104) to execute continuous or intermittent pumping in a flowing direction of periodical exchange thus to equalize the temperature difference between the relay heat equalizer (202) and the semiconductor application installation (103).

The system illustrated in FIG. 2 and FIG. 4 can directly have a heat pipe giving good heat conduction of the prior art provided at where between the heat equalizer (102) and the relay heat equalizer (202) to replace the fluid transmission duct (205), or provided at where between the relay heat equalizer (202) and the semiconductor application installation (103) to replace the fluid transmission duct (105) or replace the optional bypass duct (119) to provide the function of temperature equalization.

The relay pump (206) disposed between the heat equalizer (102) and the relay heat equalizer (202) to pump the fluid (204), and the pump (106) disposed between the relay heat equalizer (202) and the semiconductor application installation (103) to pump the fluid (104) as illustrated in FIG. 2, FIG. 4 and described above can take place at the same time or not in executing periodical change of the two-way flow pumping; or either of the pump (106) and the relay pump (206) can be selected to execute one-way continuous or intermittent pumping while the other pump executes the continuous or intermittent pumping for periodical change of the flow direction.

The pump (106) or the relay pump (206) described related to the semiconductor application installation adapted with a temperature equalizing system can be made any of the following modes:

(1) Only one pump executes one-way continuous pumping;

(2) Only one pump executes one-way intermittent pumping;

(3) Only one pump executes one-way pumping to periodically change the flow direction of the fluid pumped through the control by a valve allowing variable flow direction;

(4) Multiple pumps with different power sources execute pumping in different directions at the same time, or separately execute pumping in periodically changed flow direction of the fluid pumped;

(5) Multiple pumps in different flow directions are driven at the same time by the same power source to execute continuous pumping in different flow directions, or to further execute periodical change of the flow direction of the fluid pumped; or (6) A two-way pump capable of alternatively executing pumping directions is used to periodically change the flow direction of the fluid pumped by changing the revolving direction of the power source.

The fluid transmission duct (105), or the fluid transmission duct (205), or the optional bypass duct (119) as described related to the semiconductor application installation adapted with a temperature equalizing system is made of a material giving good heat accumulation property and in construction depending on the length needed and the specific geometric form, e.g., the duct can be made in curvature, labyrinth, or vortex form, and buried in the natural heat carrier (101) to replace or support the heat equalizer (102) in achieving heat equalization between the heat equalizer (102) and the natural heat carrier (101).

The semiconductor application installation adapted with the system to provide temperature equalization by means of the natural heat carrier described related to the semiconductor application installation adapted with a temperature equalizing system can be further provided with the following auxiliary control devices as applicable:

a filter: to be mounted to the inlet or the outlet of the fluid of each item or in the fluid transmission duct of the system to prevent the duct from being plugged and to clean the fluid; the filter can be comprised of a strainer or any other filtering device of the prior art and the filter relates to an optional item to be provided as applicable; and a bypass control valve (120): relates to a valve for controlling the flow rate of the fluid by manual, mechanical force, fluid force, or electro-magnetic force and the valve is also related to an optional item to be provided as applicable.

Those items including the heat equalizer (102), the semiconductor application installation (103), the fluid (104), the fluid transmission duct (105), the pump (106), and those optional items including temperature detection device (107), the filter (108), the auxiliary temperature regulation device (109), the control unit (110), the fluid bypass duct (119), the bypass control valve (120), and the bypass auxiliary pump (121) in the system can be provided in only one unit or in multiple units. When multiple units are provided for each item, the specification or the material can vary as applicable.

Those items including the heat equalizer (102), the semiconductor application installation (103), the fluid (104), the fluid transmission duct (105), the pump (106), the relay heat equalizer (202), another fluid (204), the relay pump (206), and those optional items including temperature detection device (107), the filter (108), the auxiliary temperature regulation device (109), the control unit (110), the fluid bypass duct (119), the bypass control valve (120), and the bypass auxiliary pump (121) in the system as described can be provided in only one unit or in multiple units. When two or more than two units are provided for each item, the specification or the material can be same or different as applicable.

Figure 5:
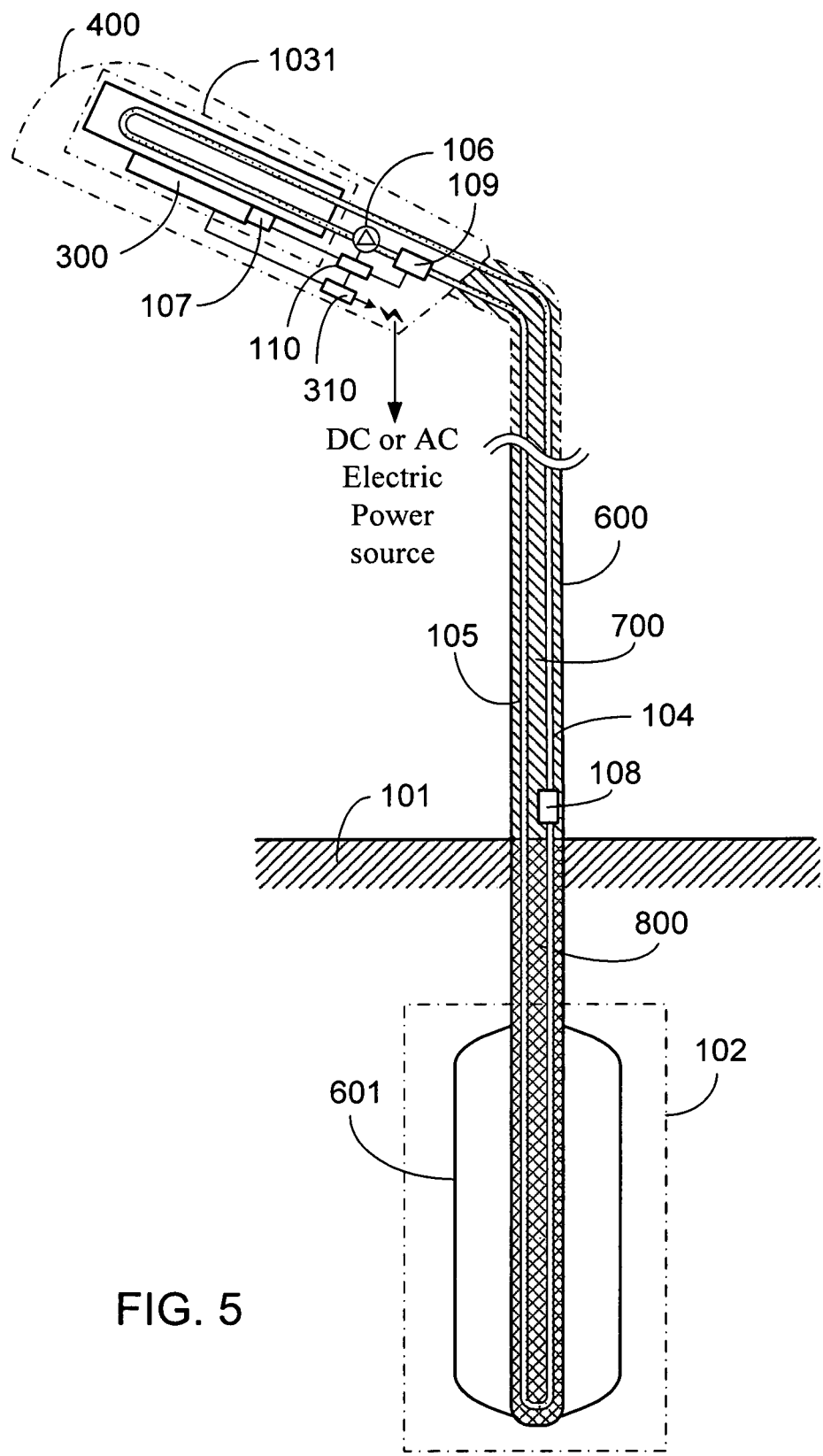
FIG. 5 is a schematic view showing the embodiment of the present invention in the application of street lamp consists of LED with heat dissipation structure at the back or semiconductor application installation with gas state lamp structure.

The schematic illustrated in FIG. 5 shows the embodiment of the present invention in the application of street lamp consists of LED with heat dissipation structure at the back or semiconductor application installation with gas state lamp structure, which is the heat carrier from the natural heat carrier (101), for providing equalizing thermal equalization generated by the LED with heat dissipation structure at the back or semiconductor application installation (1031) with gas state lamp structure consists of LED, which is mainly consist of at least one disposed fluid conduction duct (105) for pumping from pump (106), or heat equalizer (102) disposed in natural heat carrier capacity (101), driven by the convection effect from temperature fluctuation of the fluid, or from fluid passing through LED with heat dissipation structure at the back or semiconductor application installation (1031) with gas state lamp structure by fluid before flowing back through fluid transmission duct (105) including stratum, surface of earth, pond, lake, river, desert, iceberg, or ocean where presents comparatively larger and more reliable heat carrying capacity; the system is essentially comprised of:

the heat equalizer (102): relates to one made of a material with good heat conduction performance and constructed in a way to provide good heat conduction with the natural heat carrier (101); the heat equalizer (102) is provided with a fluid inlet, a fluid outlet, and an internal fluid passage; or the space in the natural heat carrier (101) allowing the fluid to flow forthwith constitutes a heat carrier for heat accumulation to replace the heat equalizer (102), made of a material with good heat conduction performance; or both of the heat equalizer (102) and the space in the natural heat carrier (101) are provided at the same time; the heat equalizer can also be the duct of natural heat capacity (101) by burying the support (600); comprising one or more than one heat equalizers (102) undertaking temperature equalization to the semiconductor application installation adapted with a temperature equalization system comprised of LED with the same heat dissipation structure at the back or semiconductor application installation (1031) with gas state lamp structure; or one heat equalizer (102) undertaking temperature equalization to one or more than one independently disposed semiconductor application installation adapted with a temperature equalization system comprised of LED with heat dissipation structure at the back or semiconductor application installation (1031) with gas state lamp structure; or two or more than two heat equalizers (102) undertaking temperature equalization to two or more than two independently disposed semiconductor application installation adapted with a temperature equalization systems comprised of LED with heat dissipation structure at the back or semiconductor application installation (1031) with gas state lamp structure.

Figure 6:
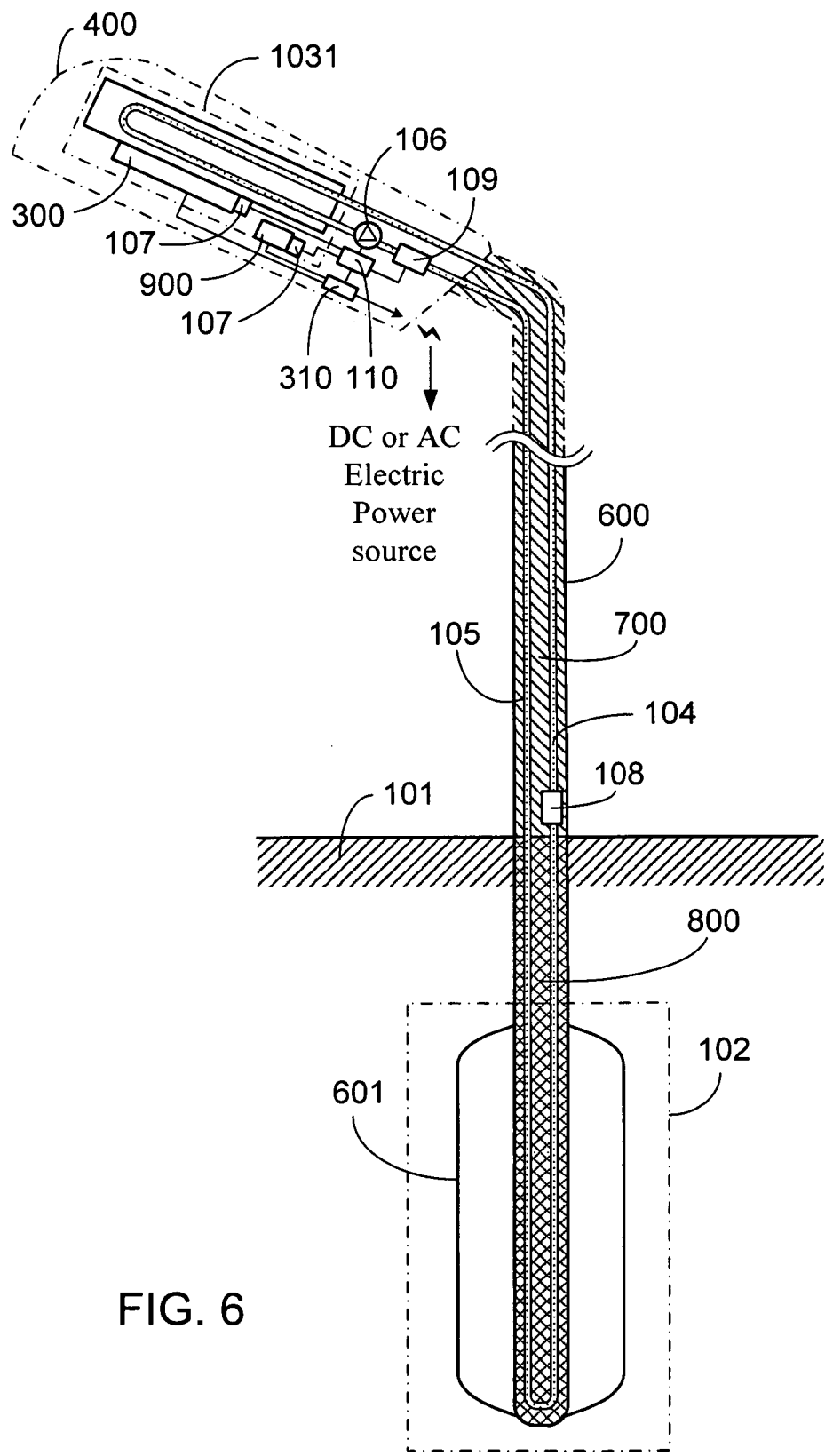
FIG. 6 is a schematic view of the embodiment of street lamp and disposed electrical energy storage device of FIG. 5 consists of LED with heat dissipation structure at the back or semiconductor application installation with gas state lamp structure.

LED with heat dissipation structure at the back or semiconductor application installation (1031) with gas state lamp structure: relates to a combination consists of an Light Emitting Diode (LED) or gas state lamp (300) and the disposed heat dissipation device, the heat dissipation device is also disposed with fluid transmission duct (105) for passing fluid (104);

driving control circuit (310): relates to switch function for control of input electrical energy for driving LED or gas state lamp (300) and execute switching on or off and brightness control or switch on or off timing according to the settings, and accepting signal of temperature detection device (107) for controlling system to reduce load or cut off power when the system temperature is abnormal; wherein the method of reducing electrical loading power stated above comprise variation of power voltage, or variation of load resistance in order to reduce input power or cut off part of the loading; the timing of the driving control circuit (310) in delivering power to activate system comprise manual operation, timed setting, random signal driving, and the brightness of the ambient as a reference, particularly the system is activated by the brightness of the ambient; the timing to switch the system comprises manual operation, timed setting, random signal driving, and the brightness of the ambient as a reference, particularly the system is activated by the brightness of the ambient; the driver control circuit (310) is the independent heat dissipation device or heat dissipation device disposed in LED with heat dissipation structure at the back or semiconductor application installation (1031) with gas state lamp structure for jointly execute temperature equalization from natural heat carrier (101) capacity;

the fluid (104): relates to a gas or a liquid provided to execute the function of heat transmission in the system; the fluid (104) is pumped by the pump (106) to flow through the heat equalizer (102) disposed in the natural heat carrier (101), the fluid transmission duct (105), the LED with heat dissipation structure at the back or semiconductor application installation (1031) with gas state lamp structure required optionally, and flows back through the fluid transmission duct (105) to the heat equalizer (102) to complete the circulation for the operation to provide temperature equalization; or to complete the circulation by fluid temperature fluctuation effect for execution of temperature equalization function;

the fluid transmission duct (105): relates to a duct structure provided at where between the heat equalizer (102) and the LED with heat dissipation structure at the back or semiconductor application installation (1031) with gas state lamp structure and connected in series with the pump (106) for the fluid (104) to circulate; to facilitate maintenance, an optional device with structure to open or to draw can be provided to the fluid transmission duct (105) as applicable;

the pump (106): relates to a fluid pump driven by electric power, mechanical force, manpower, or any other natural force, connected in series with the fluid transmission duct (105), and subject to the control by a control unit (110) to pump the fluid (104); this pumping function can be submitted by the convection effects of the temperature fluctuation of the fluid;

a temperature detector device (107): an optional item related to analog or digital dynamo-electric or solid state electronic device of the prior art disposed in LED with heat dissipation structure at the back or semiconductor application installation (1031) with gas state lamp structure to indicate the temperature, or provide signal feedback to the control unit (110) and/or driver control circuit (310) and through operating or stopping control pump (106) for system to operate in programmed temperature range, and auxiliary temperature regulating device (109) disposed in the system and activating auxiliary temperature regulating device (109) when pump (106) operating to reach programmed time and temperature yet still unable to operate in the programmed range;

a filter (108): relates to an optional item provided at the fluid suction inlet or outlet of each device mounted to the fluid circulation loop, or at a selected location in the fluid transmission duct (105) to filter fluid foreign material and prevent the duct from getting plugged and assurance of clean fluid;

an auxiliary temperature regulation device (109): an optional item related to dynamo-electric solid, gas or liquid state temperature regulation device to heat or cool the fluid (104), or a power heating or cooling device comprised of solid state or semiconductor, as subject to the control by the control unit (110) to activate auxiliary temperature regulating device (109) when system temperature drifting programmed range, to be activated to regulate the heating or cooling temperature control to the heating or cooling position of fluid (104) when the temperature in the device floats away from the range set; and the control unit (110): comprised of dynamo-electric or solid state electronic circuit and related software to control fluid pump (106) for pumping one-way continuous or intermittent fluid (104) depending on the temperature detection signal and system temperature setting of the temperature detection device (107), and to control the direction and flow rate of the fluid (104) between the heat equalizer (102) and the LED with heat dissipation structure at the back or semiconductor application installation (1031) with gas state lamp structure; and to control or stop the pump (106) for the system to operate in the programmed temperature range, and to dispose auxiliary temperature regulating device in the system for the pump (106) to operate and reach programmed time and temperature yet still not operating in the programmed range to activate auxiliary temperature regulating device (109), and to control auxiliary temperature regulating device (109) as auxiliary temperature regulation; and to control system to reduce load or cut off power when system temperature is abnormal;

support (600); relates to one or more than one pillar or frame structure, the low end is disposed with heat equalizer (102) disposed in natural heat carrier (101), wherein the heat equalizer (102) can be disposed with thermal conduction wing (601) depending on the need to increase heat conduction effect, the support (600) is also for disposing LED with heat dissipation structure at the back or semiconductor application installation (1031) with gas state lamp structure comprising LED or gas state lamp (300) with heat dissipation device, and optical structure and housing structure of related lamp (400), and the below portion or total unit device including controlling unit (110), pump (106), temperature detector device (107), and filter (108); above stated LED with heat dissipation structure at the back or semiconductor application installation (1031) with gas state lamp structure disposed at the support (600) has fluid transmission duct, and the inlet and outlet of the fluid is for connecting to fluid transmission duct (105), respectively for leading to heat equalizer (102) to form closed flow path; internal of fluid transmission duct (105) is for flowing fluid (104); fluid (104) executes circulation from fluid temperature fluctuation effect, or executes pumping from added pump (106) in order for the fluid (104) to execute temperature equalizing transmission between the heat equalizer (102) and the LED with heat dissipation structure at the back or semiconductor application installation (1031) with gas state lamp structure;

heat insulating material (700): relates to all kinds of heat insulating material for disposing between the support (600) with exposed natural heat carrier (101) and the internal of fluid transmission duct (105) in order to provide heat insulation effect to the outside world and reduce heat energy from escaping; such heat insulating material (700) is optionally disposed according to the need; the insulating material also can be replaced by extracting air to achieve vacuum effect, and the support (600) is made of material with better heat insulating material, or not disposed if the fluid transmission duct (105) is made of structure with heat insulating material;

heat conductor (800): relates to material made of heat conducting material for the support (600) to dispose between the inside of the root duct of natural heat carrier (101) and the fluid transmission duct (105) to facilitate the temperature equalizing effect of fluid (104) of fluid transmission duct (105) through heat equalizer (102) and natural temperature carrier (101); heat conductor is also made from one body structure for the heat equalizer (102);

FIG. 6 is the schematic showing the embodiment of street lamp consists of LED with heat dissipation structure at the back or semiconductor application installation with gas state lamp structure and disposed electricity storage device of FIG. 5, which relates to the temperature of natural heat carrier (101) consist of solid state or liquid state natural heat carrier including stratum, surface of earth, pond, lake, river, desert, iceberg, or ocean where presents comparatively larger and more reliable heat carrying capacity, in order to execute temperature equalization to the heat generated by LED with heat dissipation structure at the back or semiconductor application installation (1031) with gas state lamp structure and electricity storage device (900) consist of LED, where the main structure is disposed with at least a fluid transmission duct (105) for pumping by pump (106), or driven by the convection effect of fluid heat fluctuation, or by the fluid for the fluid to flow through LED with heat dissipation structure at the back or semiconductor application installation (1031) with gas state lamp structure and electricity storage device (900), and through fluid transmission duct (105) in order to flow back to heat equalizer (102) disposed in natural heat carrier (101) and constitute circulation of fluid; the system is essentially comprised of:

the heat equalizer (102): relates to one made of a material with good heat conduction performance and constructed in a way to provide good heat conduction with the natural heat carrier (101); the heat equalizer (102) is provided with a fluid inlet, a fluid outlet, and an internal fluid passage; or the space in the natural heat carrier (101) allowing the fluid to flow forthwith constitutes a heat carrier for heat accumulation to replace the heat equalizer (102), made of a material with good heat conduction performance; or both of the heat equalizer (102) and the space in the natural heat carrier (101) are provided at the same time; the heat equalizer can also be the duct of natural heat capacity (101) by burying the support (600); comprising one or more than one heat equalizers (102) undertaking temperature equalization to the semiconductor application installation adapted with a temperature equalization system comprised of LED with heat dissipation structure at the back or semiconductor application installation (1031) with gas state lamp structure and/or electricity storage device (900); or one heat equalizer (102) undertaking temperature equalization to one or more than one independently disposed semiconductor application installation adapted a with temperature equalization system comprised of LED with heat dissipation structure at the back or semiconductor application installation (1031) with gas state lamp structure and/or electricity storage device (900); or two or more than two heat equalizers (102) undertaking temperature equalization to two or more than two independently disposed semiconductor application installation adapted with a temperature equalization systems comprised of LED with heat dissipation structure at the back or semiconductor application installation (1031) with gas state lamp structure and/or electricity storage device (900).

Figure 7:
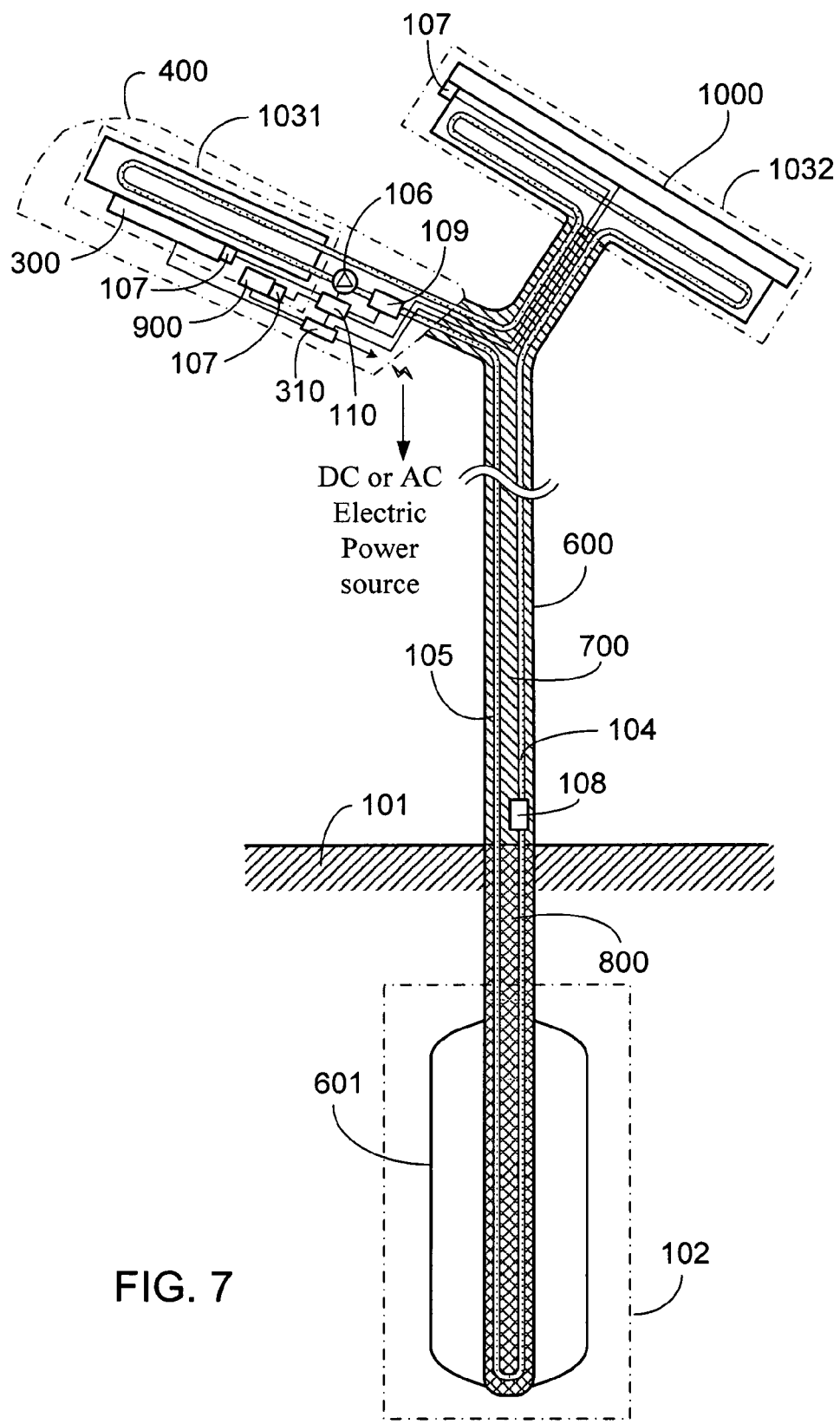
FIG. 7 is a schematic view of a further embodiment showing the photovoltaic generation device disposed with photovoltaic function in FIG. 6.

LED with heat dissipation structure at the back or semiconductor application installation (1031) with gas state lamp structure: relates to a combination consists of an Light Emitting Diode (LED) or gas state lamp (300) and the disposed heat dissipation device, the heat dissipation device is also disposed with fluid transmission duct (105) for passing fluid (104);

driving control circuit (310): relates to switch function for control of input electrical energy for driving LED or gas state lamp (300) and execute switching on or off and brightness control or switch on or off timing according to the settings, and accepting signal of temperature detection device (107) for controlling system to reduce load or cut off power when the system temperature is abnormal; wherein the method of reducing electrical loading power stated above comprise variation of power voltage, or variation of load resistance in order to reduce input power or cut off part of the loading; the timing of the driving control circuit (310) in delivering power to activate system comprise manual operation, timed setting, random signal driving, and the brightness of the ambient as a reference, particularly the system is activated by the brightness of the ambient; the timing to switch the system comprises manual operation, timed setting, random signal driving, and the brightness of the ambient as a reference, particularly the system is activated by the brightness of the ambient; the driver control circuit (310) is the independent heat dissipation device or heat dissipation device disposed in LED with heat dissipation structure at the back or semiconductor application installation (1031) with gas state lamp structure for jointly execute temperature equalization from natural heat carrier (101) capacity;

Electricity energy storage device (900): relates to constituents of all kinds of rechargeable secondary batteries or capacitors or supercapacitors, energy storage and providing electricity for LED or gas state lamp (300); the electricity energy storage device (900) can be disposed with temperature detection device (107) and fluid transmission duct (105), depending on the need.

the fluid (104): relates to a gas or a liquid provided to execute the function of heat transmission in the system; the fluid (104) is pumped by the pump (106) to flow through the heat equalizer (102) disposed in the natural heat carrier (101), the fluid transmission duct (105), and optionally flows serially or in parallel through the LED with heat dissipation structure at the back or semiconductor application installation (1031) with gas state lamp structure and/or electrical energy storage device (900), and flows back through the fluid transmission duct (105) to the heat equalizer (102) to complete the circulation for the operation to provide temperature equalization; or to complete the circulation by fluid temperature fluctuation effect for execution of temperature equalization function;

the fluid transmission duct (105): relates to a duct structure provided at where between the heat equalizer (102) and the LED with heat dissipation structure at the back or semiconductor application installation (1031) with gas state lamp structure and/or electrical energy storage device (900), and connected in series with the pump (106) for the fluid (104) to circulate; to facilitate maintenance, an optional device with structure to open or to draw can be provided to the fluid transmission duct (105) as applicable;

the pump (106): relates to a fluid pump driven by electric power, mechanical force, manpower, or any other natural force, connected in series with the fluid transmission duct (105), and subject to the control by a control unit (110) to pump the fluid (104); this pumping function can be submitted by the convection effects of the temperature fluctuation of the fluid;

a temperature detector device (107): an optional item related to analog or digital dynamo-electric or solid state electronic device of the prior art disposed in LED with heat dissipation structure at the back or semiconductor application installation (1031) with gas state lamp structure and/or electrical energy storage device (900) to indicate the temperature, or provide signal feedback to the control unit (110) and/or driver control circuit (310), and through operating or stopping control pump (106) for system to operate in programmed temperature range, and auxiliary temperature regulating device (109) disposed in the system and activating auxiliary temperature regulating device (109) when pump (106) operating to reach programmed time and temperature yet still unable to operate in the programmed range;

a filter (108): relates to an optional item provided at the fluid suction inlet or outlet of each device mounted to the fluid circulation loop, or at a selected location in the fluid transmission duct (105) to filter fluid foreign material and prevent the duct from getting plugged and assurance of clean fluid;

an auxiliary temperature regulation device (109): an optional item related to dynamo-electric solid, gas or liquid state temperature regulation device to heat or cool the fluid (104), or a power heating or cooling device comprised of solid state or semiconductor, as subject to the control by the control unit (110) to activate auxiliary temperature regulating device (109) when system temperature drifting programmed range, to be activated to regulate the heating or cooling temperature control to the heating or cooling position of fluid (104) when the temperature in the device floats away from the range set; and the control unit (110): comprised of dynamo-electric or solid state electronic circuit and related software to control fluid pump (106) for pumping one-way continuous or intermittent fluid (104) depending on the temperature detection signal and system temperature setting of the temperature detection device (107), and to control the direction and flow rate of the fluid (104) between the heat equalizer (102) and the LED with heat dissipation structure at the back or semiconductor application installation (1031) with gas state lamp structure and/or electrical energy storage device (900); and to control or stop the pump (106) for the system to operate in the programmed temperature range, and to dispose auxiliary temperature regulating device in the system for the pump (106) to operate and reach programmed time and temperature yet still not operating in the programmed range to activate auxiliary temperature regulating device (109), and to control auxiliary temperature regulating device (109) as auxiliary temperature regulation; and to control system to reduce load or cut off power when system temperature is abnormal;

support (600); relates to one or more than one pillar or frame structure, the low end is disposed with heat equalizer (102) disposed in natural heat carrier (101), wherein the heat equalizer (102) can be disposed with thermal conduction wing (601) depending on the need to increase heat conduction effect, the support (600) is also for disposing LED with heat dissipation structure at the back or semiconductor application installation (1031) with gas state lamp structure comprising LED or gas state lamp (300) with heat dissipation device, and optical structure and housing structure of related lamp (400) and electrical energy storage device (900), and the below portion or total unit device including controlling unit (110), pump (106), temperature detector device (107), and filter (108); above stated LED with heat dissipation structure at the back or semiconductor application installation (1031) with gas state lamp structure and/or electrical energy storage device (900) disposed at the support (600) has fluid transmission duct, and the inlet and outlet of the fluid is for connecting to fluid transmission duct (105), respectively for leading to heat equalizer (102) to form closed flow path; internal of fluid transmission duct (105) is for flowing fluid (104); fluid (104) executes circulation from fluid temperature fluctuation effect, or executes pumping from added pump (106) in order for the fluid (104) to execute temperature equalizing transmission between the heat equalizer (102) and the LED with heat dissipation structure at the back or semiconductor application installation (1031) with gas state lamp structure (1031) and/or electrical energy storage device (900);

heat insulating material (700): relates to all kinds of heat insulating material for disposing between the support (600) with exposed natural heat carrier (101) and the internal of fluid transmission duct (105) in order to provide heat insulation effect to the outside world and reduce heat energy from escaping; such heat insulating material (700) is optionally disposed according to the need; the insulating material also can be replaced by extracting air to achieve vacuum effect, and the support (600) is made of material with better heat insulating material, or not disposed if the fluid transmission duct (105) is made of structure with heat insulating material;

heat conductor (800): relates to material made of heat conducting material for the support (600) to dispose between the inside of the root duct of natural heat carrier (101) and the fluid transmission duct (105) to facilitate the temperature equalizing effect of fluid (104) of fluid transmission duct (105) through heat equalizer (102) and natural temperature carrier (101); heat conductor is also made from one body structure for the heat equalizer (102);

FIG. 7 is the schematic further showing the photovoltaic generation device disposed with photovoltaic energy of FIG. 6, which relates to the temperature of natural heat carrier (101) consist of solid state or liquid state natural heat carrier including stratum, surface of earth, pond, lake, river, desert, iceberg, or ocean where presents comparatively larger and more reliable heat carrying capacity, in order to execute temperature equalization to the heat generated by LED with heat dissipation structure at the back or semiconductor application installation (1031) with gas state lamp structure comprising LED or gas state lamp (300), or and/or semiconductor application installation (1032) comprising photovoltaic generation device with heat dissipation structure at the back comprising photovoltaic generation device (1000) and/or heat generated by electrical energy storage device (900) for temperature equalization; where the main structure is disposed with at least a fluid transmission duct (105) for pumping by pump (106), or driven by the convection effect of fluid heat fluctuation, or by the fluid for the fluid to flow through LED with heat dissipation structure at the back or semiconductor application installation (1031) with gas state lamp structure, and/or semiconductor application installation (1032) comprising photovoltaic generation device with heat dissipation structure at the back comprising photovoltaic generation device (1000), and/or electrical energy storage device (900), then through fluid transmission duct (105) in order to flow back to heat equalizer (102) disposed in natural heat carrier (101) and constitute circulation of fluid; its major structure comprising:

the heat equalizer (102): relates to one made of a material with good heat conduction performance and constructed in a way to provide good heat conduction with the natural heat carrier (101); the heat equalizer (102) is provided with a fluid inlet, a fluid outlet, and an internal fluid passage; or the space in the natural heat carrier (101) allowing the fluid to flow forthwith constitutes a heat carrier for heat accumulation to replace the heat equalizer (102), made of a material with good heat conduction performance; or both of the heat equalizer (102) and the space in the natural heat carrier (101) are provided at the same time; the heat equalizer can also be the duct of natural heat capacity (101) by burying the support (600); comprising one or more than one heat equalizers (102) undertaking temperature equalization to the semiconductor application installation adapted with a temperature equalization system comprised of LED with heat dissipation structure at the back or semiconductor application installation (1031) with gas state lamp structure and/or semiconductor application installation (1032) comprising photovoltaic generation device with heat dissipation structure at the back and/or electricity storage device (900); or one heat equalizer (102) undertaking temperature equalization to one or more than one independently disposed semiconductor application installation adapted with a temperature equalization system comprised of LED with heat dissipation structure at the back or semiconductor application installation (1031) with gas state lamp structure and/or semiconductor application installation (1032) comprising photovoltaic generation device with heat dissipation structure at the back and/or electricity storage device (900); or two or more than two heat equalizers (102) undertaking temperature equalization to two or more than two independently disposed semiconductor application installation adapted with a temperature equalization systems comprised of LED with heat dissipation structure at the back or semiconductor application installation (1031) with gas state lamp structure and/or semiconductor application installation (1032) comprising photovoltaic generation device with heat dissipation structure at the back and/or electricity storage device (900).

Figure 8:
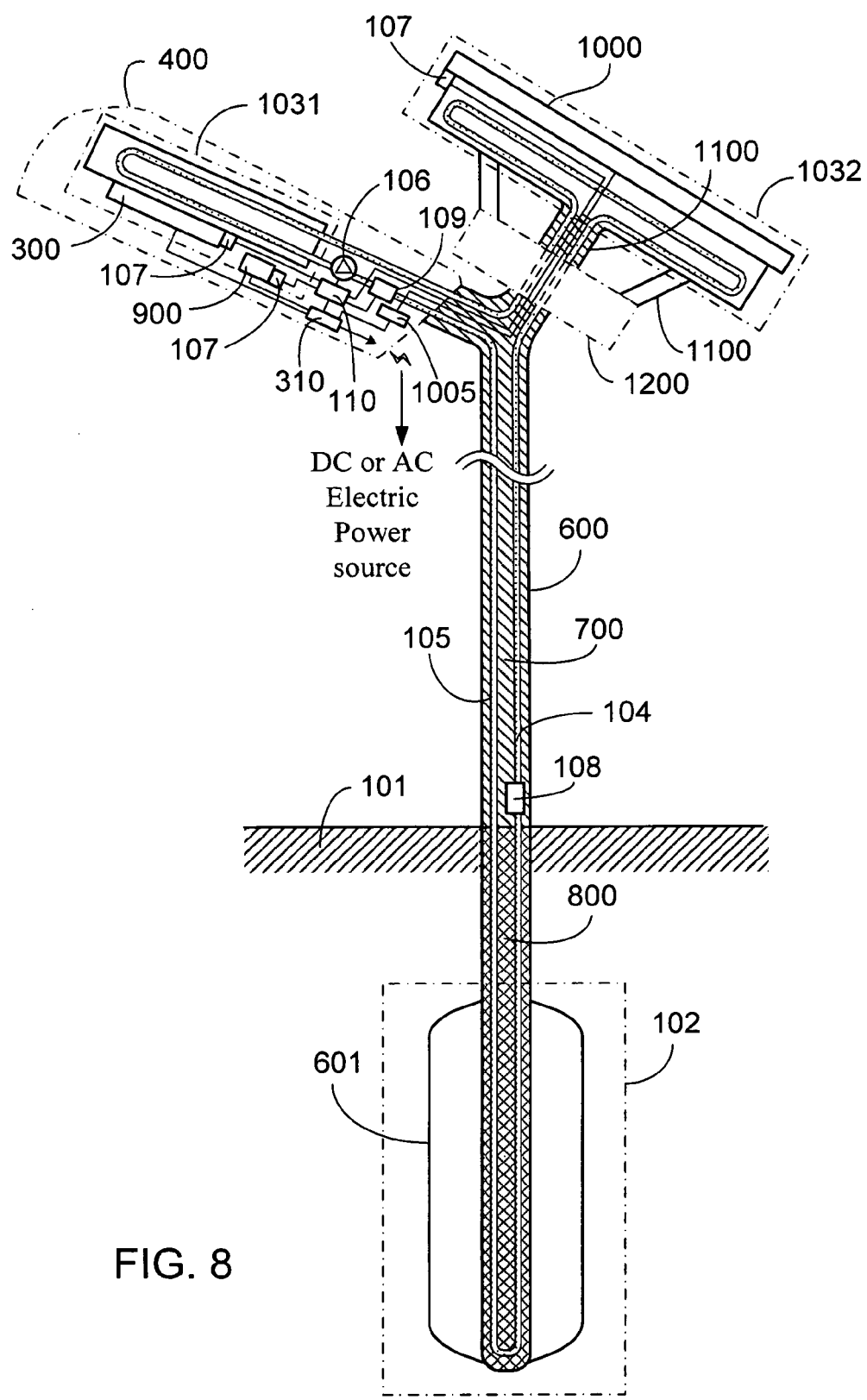
FIG. 8 is a schematic view of another embodiment showing the auxiliary supporting arm of light source tracking mechanism device of FIG. 7.
Figure 9:
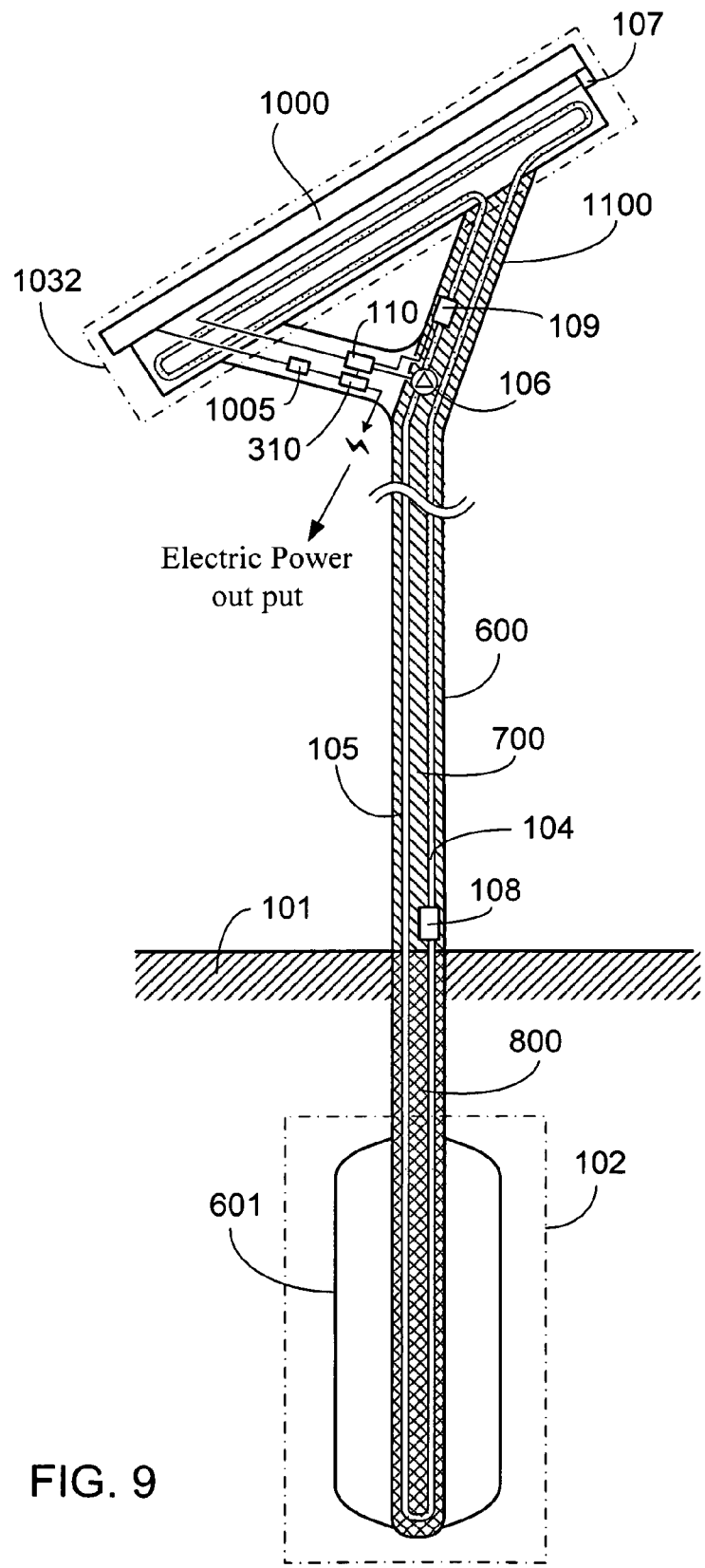
FIG. 9 is a schematic view of the embodiment of the present invention in the application of photovoltaic generation device.
Figure 10:
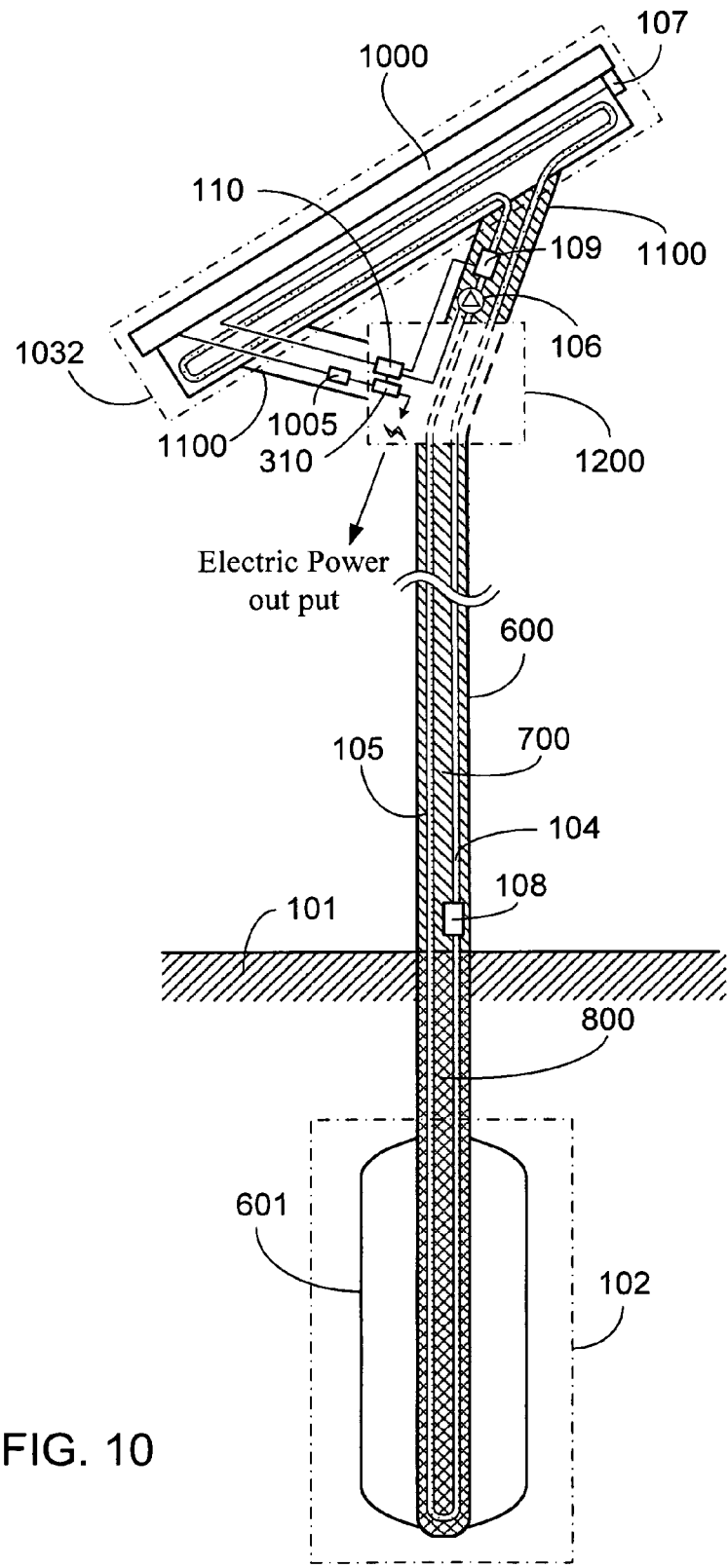
FIG. 10 is a schematic view of another embodiment of auxiliary supporting arm of the disposed light source tracking mechanism device of FIG. 9.
Figure 11:
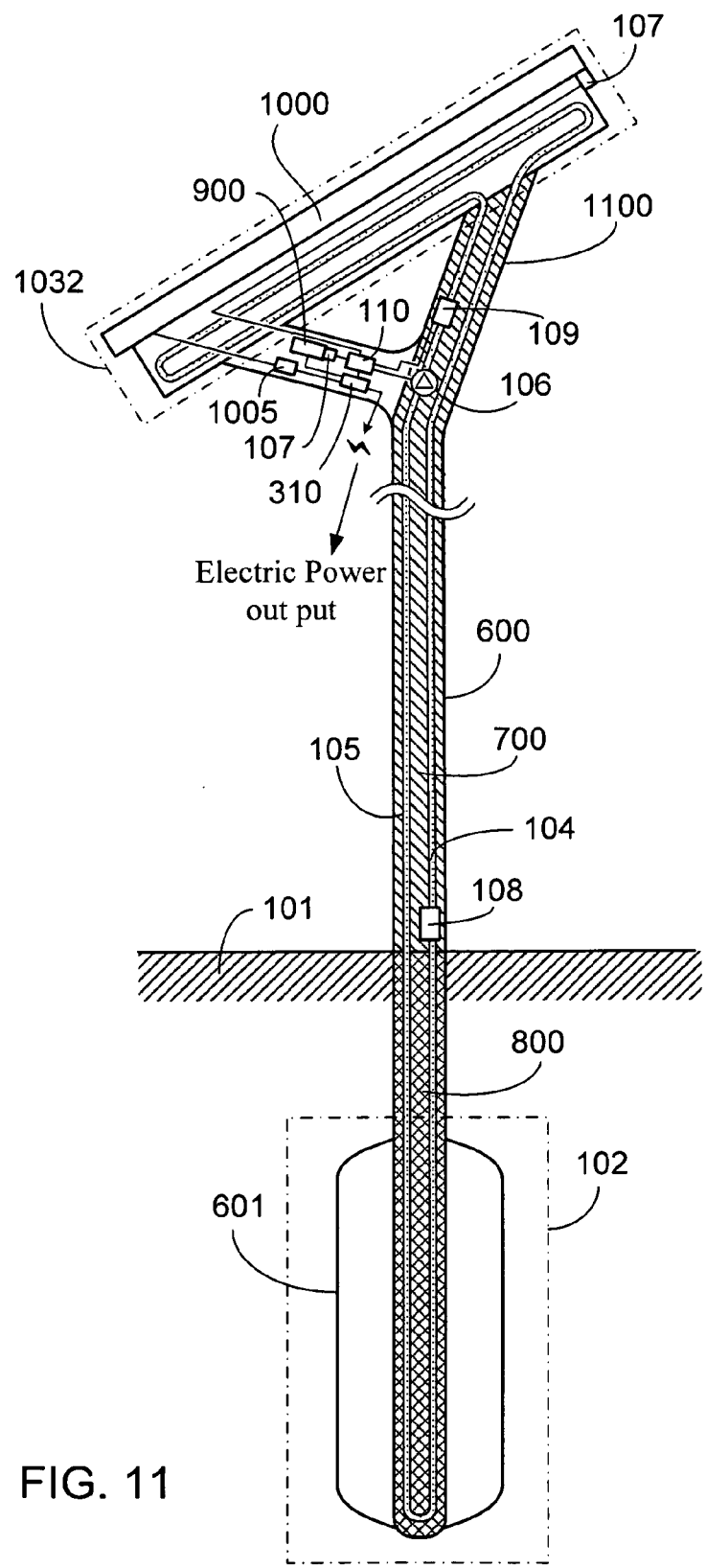
FIG. 11 is a schematic view of embodiment of the present invention in the application of photovoltaic generation device disposed with electrical energy storage device.
Figure 12:
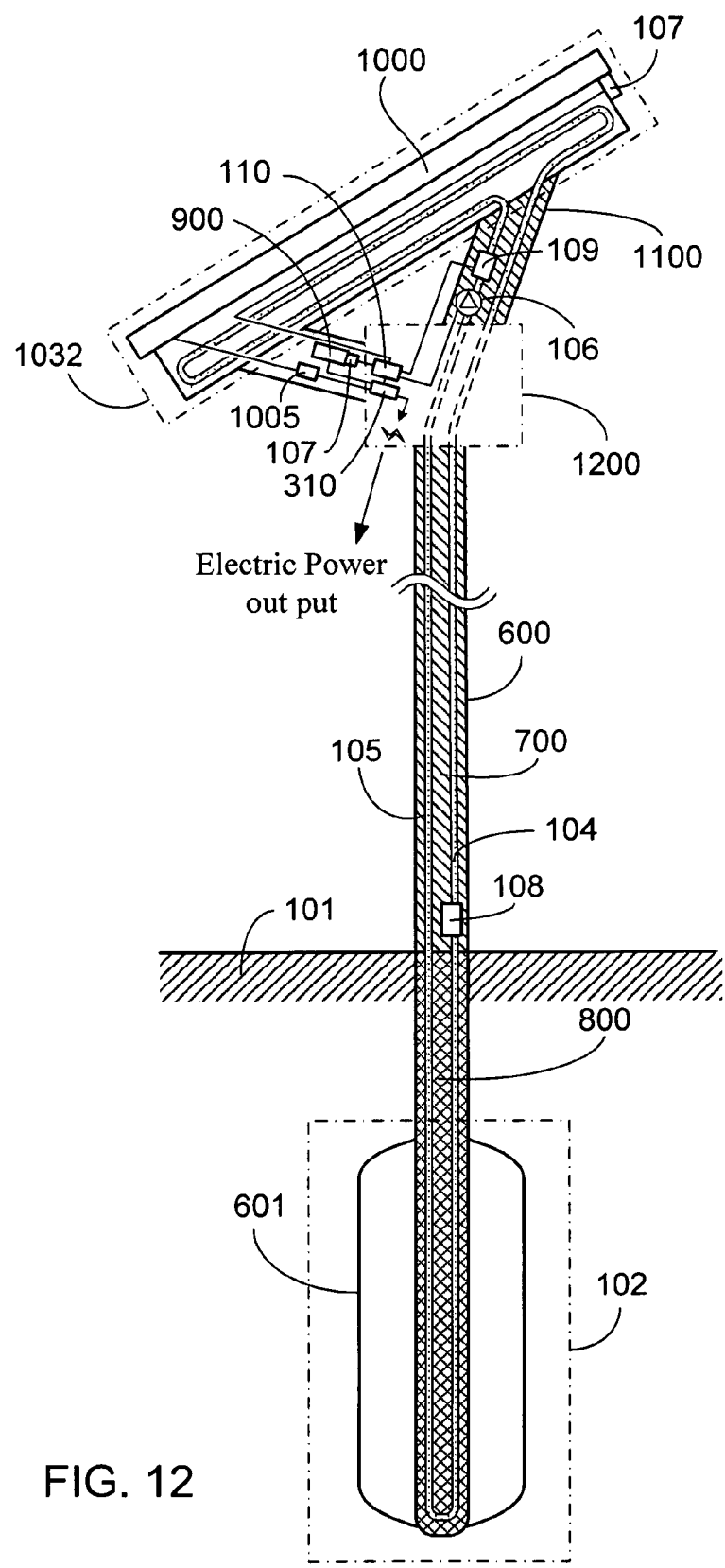
FIG. 12 is another schematic view of the embodiment of the present invention disposed with auxiliary supporting arm having light source tracking mechanism device.

LED with heat dissipation structure at the back or semiconductor application installation (1031) with gas state lamp structure: relates to a combination consists of an Light Emitting Diode (LED) or gas state lamp (300) and the disposed heat dissipation device, the heat dissipation device is also disposed with fluid transmission duct (105) for passing fluid (104);

driving control circuit (310): relates to switch function for control of input electrical energy for driving LED or gas state lamp (300) and execute switching on or off and brightness control or switch on or off timing according to the settings, and accepting signal of temperature detection device (107) for controlling system to reduce load or cut off power when the system temperature is abnormal; wherein the method of reducing electrical loading power stated above comprise variation of power voltage, or variation of load resistance in order to reduce input power or cut off part of the loading; the timing of the driving control circuit (310) in delivering power to activate system comprise manual operation, timed setting, random signal driving, and the brightness of the ambient as a reference, particularly the system is activated by the brightness of the ambient; the timing to switch the system comprises manual operation, timed setting, random signal driving, and the brightness of the ambient as a reference, particularly the system is activated by the brightness of the ambient; the driver control circuit (310) is the independent heat dissipation device or heat dissipation device disposed in LED with heat dissipation structure at the back or semiconductor application installation (1031) with gas state lamp structure for jointly execute temperature equalization from natural heat carrier (101) capacity;

Electricity energy storage device (900): relates to constituents of all kinds of rechargeable secondary batteries or capacitors or supercapacitors, energy storage and providing electricity for LED or gas state lamp (300); the electricity energy storage device (900) can be disposed with temperature detection device (107) and fluid transmission duct (105), depending on the need.

semiconductor application installation (1032) comprising photovoltaic generation device with heat dissipation structure at the back: relates to glass substrate or section of semiconductor of photovoltaic with the back side disposes photovoltaic energy device (1000) with heat dissipation structure, for providing transmission of electricity generated under the light to electricity storing device (900) or for providing electricity to LED or gas state lamp (300);

Electrical adjusting device (1005): comprising of dynamo or solid state semiconductor circuit component or integrated circuit, for adjusting output voltage of photovoltaic generation device (1000);

the fluid (104): relates to a gas or a liquid provided to execute the function of heat transmission in the system; the fluid is pumped by the pump (106) to flow through the heat equalizer (102) disposed in the natural heat carrier (101), the fluid transmission duct (105), and optionally one of the three methods including the LED with heat dissipation structure at the back or semiconductor application installation (1031) with gas state lamp structure and electrical energy storage device (900) and semiconductor application installation (1032) comprising photovoltaic generation device with heat dissipation structure at the back in serial or parallel method, and flows back through the fluid transmission duct (105) to the heat equalizer (102) to complete the circulation for the operation to provide temperature equalization; or to complete the circulation by fluid temperature fluctuation effect for execution of temperature equalization function;

the fluid transmission duct (105): relates to a duct structure provided at where between the heat equalizer (102) and one of the three methods including the LED with heat dissipation structure at the back or semiconductor application installation (1031) with gas state lamp structure and semiconductor application installation (1032) comprising photovoltaic generation device with heat dissipation structure at the back and electricity storing device (900) and for connected in series with the pump (106) for the fluid (104) to circulate; to facilitate maintenance, an optional device with structure to open or to draw can be provided to the fluid transmission duct (105) as applicable;

the pump (106): relates to a fluid pump driven by electric power, mechanical force, manpower, or any other natural force, connected in series with the fluid transmission duct (105), and subject to the control by a control unit (110) to pump the fluid (104); this pumping function can be submitted by the convection effects of the temperature fluctuation of the fluid;

a temperature detector device (107): an optional item related to analog or digital dynamo-electric or solid state electronic device of the prior art disposed in LED with heat dissipation structure at the back or semiconductor application installation (1031) with gas state lamp structure and/or semiconductor application installation (1032) comprising photovoltaic generation device with heat dissipation structure at the back and/or electrical energy storage device (900) to indicate the temperature, or provide signal feedback to the control unit (110) and/or electrical adjusting device (1005) and through operating or stopping control pump (106) for system to operate in programmed temperature range, and auxiliary temperature regulating device (109) disposed in the system and activating auxiliary temperature regulating device (109) when pump (106) operating to reach programmed time and temperature yet still unable to operate in the programmed range;

a filter (108): relates to an optional item provided at the fluid suction inlet or outlet of each device mounted to the fluid circulation loop, or at a selected location in the fluid transmission duct (105) to filter fluid foreign material and prevent the duct from getting plugged and assurance of clean fluid;

an auxiliary temperature regulation device (109): an optional item related to dynamo-electric solid, gas or liquid state temperature regulation device to heat or cool the fluid (104), or a power heating or cooling device comprised of solid state or semiconductor, as subject to the control by the control unit (110) to activate auxiliary temperature regulating device (109) when system temperature drifting programmed range, to be activated to regulate the heating or cooling temperature control to the heating or cooling position of fluid (104) when the temperature in the device floats away from the range set; and the control unit (110): comprised of dynamo-electric or solid state electronic circuit and related software to control fluid pump (106) for pumping one-way continuous or intermittent fluid (104) depending on the temperature detection signal and system temperature setting of the temperature detection device (107), and to control the direction and flow rate of the fluid (104) between the heat equalizer (102) and the LED with heat dissipation structure at the back or semiconductor application installation (1031) with gas state lamp structure and/or semiconductor application installation (1032) comprising photovoltaic generation device with heat dissipation structure at the back and/or electrical energy storage device (900); and to control or stop the pump (106) for the system to operate in the programmed temperature range, and to dispose auxiliary temperature regulating device in the system for the pump (106) to operate and reach programmed time and temperature yet still not operating in the programmed range to activate auxiliary temperature regulating device (109), and to control auxiliary temperature regulating device (109) as auxiliary temperature regulation; and to control system to reduce load or cut off power when system temperature is abnormal;

support (600); one or more than one pillar or frame structures, the low end is disposed with heat equalizer (102) in natural heat carrier (101), wherein the heat equalizer (102) can be disposed in the heat conduction wing (601) to increase heat conduction effect, the support (600) is for disposing the LED with heat dissipation structure at the back or semiconductor application installation (1031) with gas state lamp structure configured by the LED or gas state lamp (300), and optical structure and housing structure of related lamp (400), and semiconductor application installation (1032) comprising photovoltaic generation device with heat dissipation structure at the back and electrical energy storage device (900), and part or all of the unit devices listed below including controlling unit (110), pump (106), temperature detector device (107), filter (108), wherein the semiconductor application installation (1032) comprising photovoltaic generation device with heat dissipation structure at the back is optionally disposed at high end or low end or middle section of the support or additional auxiliary supporting arm (1100), or as illustrated in FIG. 8 additional auxiliary supporting arm (1100) of light source tracking device (1200) is disposed for improving the semiconductor application installation (1032) comprising photovoltaic generation device with heat dissipation structure at the back; above stated LED with heat dissipation structure at the back or semiconductor application installation (1031) with gas state lamp structure disposed at the support (600) and/or semiconductor application installation (1032) comprising photovoltaic generation device with heat dissipation structure at the back and/or electricity storage device (900) has fluid transmission duct, and the inlet and outlet of the fluid is for connecting to fluid transmission duct (105) for leading to heat equalizer (102) to form closed flow path; internal of fluid transmission duct (105) is for flowing fluid (104); fluid (104) executes circulation from fluid temperature fluctuation effect, or executes pumping from additional pump (106) in order for the fluid (104) to execute temperature equalizing transmission between heat equalizer (102) and LED with heat dissipation structure at the back or semiconductor application installation (1031) with gas state lamp structure and/or semiconductor application installation (1032) comprising photovoltaic generation device with heat dissipation structure at the back and/or electricity storage device (900);

heat insulating material (700): relates to all kinds of heat insulating material for disposing between the support (600) with exposed natural heat carrier and the internal of fluid transmission duct (105) in order to provide heat insulation effect to the outside world and reduce heat energy from escaping; such heat insulating material (700) is optionally disposed according to the need; the insulating material also can be replaced by extracting air to achieve vacuum effect, and the support (600) is made of material with better heat insulating material, or not disposed if the fluid transmission duct (105) is made of structure with heat insulating material;

heat conductor (800): relates to material made of heat conducting material for the support (600) to dispose between the inside of the root duct of natural heat carrier (101) and the fluid transmission duct (105) to facilitate the temperature equalizing effect of fluid (104) of fluid transmission duct (105) through heat equalizer (102) and natural temperature carrier (101); heat conductor is also made from one body structure for the heat equalizer (102);

FIG. 9 is the schematic of embodiment of present invention showing the photovoltaic generation device disposed with photovoltaic energy, which relates to the temperature of natural heat carrier (101) consist of solid state or liquid state natural heat carrier including stratum, surface of earth, pond, lake, river, desert, iceberg, or ocean where presents comparatively larger and more reliable heat carrying capacity, in order to execute temperature equalization to the heat generated by semiconductor application installation (1032) comprising photovoltaic generation device with heat dissipation structure at the back consists of photovoltaic generation device (1000) of photovoltaic energy, where the main structure is disposed with at least a fluid transmission duct (105) for pumping by pump (106), or driven by the convection effect of fluid heat fluctuation, for the fluid to flow through semiconductor application installation (1032) comprising photovoltaic generation device with heat dissipation structure at the back, and through fluid transmission duct (105) in order to flow back to heat equalizer (102) disposed in natural heat carrier (101) and constitute circulation of fluid; its main structure comprising:

the heat equalizer (102): relates to one made of a material with good heat conduction performance and constructed in a way to provide good heat conduction with the natural heat carrier (101); the heat equalizer (102) is provided with a fluid inlet, a fluid outlet, and an internal fluid passage; or the space in the natural heat carrier (101) allowing the fluid to flow forthwith constitutes a heat carrier for heat accumulation to replace the heat equalizer (102), made of a material with good heat conduction performance; or both of the heat equalizer (102) and the space in the natural heat carrier (101) are provided at the same time; the heat equalizer can also be the duct of natural heat capacity (101) by burying the support (600); comprising one or more than one heat equalizers (102) undertaking temperature equalization to the semiconductor application installation adapted with a temperature equalization system comprised of semiconductor application installation (1032) comprising photovoltaic generation device with heat dissipation structure at the back; or one heat equalizer (102) undertaking temperature equalization to one or more than one independently disposed semiconductor application installation adapted with a temperature equalization system comprised of semiconductor application installation (1032) comprising photovoltaic generation device with heat dissipation structure at the back; or two or more than two heat equalizers (102) undertaking temperature equalization to two or more than two independently disposed semiconductor application installation adapted with a temperature equalization systems comprised of semiconductor application installation (1032) comprising photovoltaic generation device with heat dissipation structure at the back.

driver control circuit (310): relates to voltage or electrical current outputted by photovoltaic device (1000) by controlling photovoltaic energy;

semiconductor application installation (1032) comprising photovoltaic generation device with heat dissipation structure at the back: relates to the back side disposes photovoltaic energy device (1000) with heat dissipation structure from glass substrate or carrier of photovoltaic semiconductor and disposed with fluid transmission duct, for providing transmission of electricity generated under the light to electrical adjustment device (1005) before output of electricity;

Electrical adjusting device (1005): comprising of dynamo or solid state semiconductor circuit component or integrated circuit, for adjusting output voltage of photovoltaic generation device (1000);

the fluid (104): relates to a gas or a liquid provided to execute the function of heat transmission in the system; the fluid is pumped by the pump (106) to flow through the heat equalizer (102) disposed in the natural heat carrier (101) and/or the fluid transmission duct (105) and/or semiconductor application installation (1032) comprising photovoltaic generation device with heat dissipation structure at the back, and flows back through the fluid transmission duct (105) to the heat equalizer (102) to complete the circulation for the operation to provide temperature equalization; or to complete the circulation by fluid temperature fluctuation effect for execution of temperature equalization function;

the fluid transmission duct (105): relates to a duct structure provided at where between the heat equalizer (102) and semiconductor application installation (1032) comprising photovoltaic generation device with heat dissipation structure at the back and for connected in series with the pump (106) for the fluid (104) to circulate; to facilitate maintenance, an optional device with structure to open or to draw can be provided to the fluid transmission duct (105) as applicable;

the pump (106): relates to a fluid pump driven by electric power generated by photovoltaic generation device (1000) or electric power of connected electricity storage device or other electric power, or mechanical force, or manpower, or any other natural force, connected in series with the fluid transmission duct (105), and subject to the control by a control unit (110) to pump the fluid (104); this pumping function can be submitted by the convection effects of the temperature fluctuation of the fluid;

a temperature detector device (107): an optional item related to analog or digital dynamo-electric or solid state electronic device of the prior art disposed in semiconductor application installation (1032) comprising photovoltaic generation device with heat dissipation structure at the back to indicate the temperature, or provide signal feedback to the control unit (110) and/or electrical adjusting device (1005) and through operating or stopping control pump (106) for system to operate in programmed temperature range, and auxiliary temperature regulating device (109) disposed in the system and activating auxiliary temperature regulating device (109) when pump (106) operating to reach programmed time and temperature yet still unable to operate in the programmed range;

a filter (108): relates to an optional item provided at the fluid suction inlet or outlet of each device mounted to the fluid circulation loop, or at a selected location in the fluid transmission duct (105) to filter fluid foreign material and prevent the duct from getting plugged and assurance of clean fluid;

an auxiliary temperature regulation device (109): an optional item related to dynamo-electric solid, gas or liquid state temperature regulation device to heat or cool the fluid (104), or a power heating or cooling device comprised of solid state or semiconductor, as subject to the control by the control unit (110) to activate auxiliary temperature regulating device (109) when system temperature drifting programmed range, to be activated to regulate the heating or cooling temperature control to the heating or cooling position of fluid (104) when the temperature in the device floats away from the range set; and the control unit (110): comprised of dynamo-electric or solid state electronic circuit and related software to control fluid pump (106) for pumping one-way continuous or intermittent fluid (104) depending on the temperature detection signal and system temperature setting of the temperature detection device (107), and to control the direction and flow rate of the fluid (104) between the heat equalizer (102) and/or the semiconductor application installation (1032) comprising photovoltaic generation device with heat dissipation structure at the back; and to control or stop the pump (106) for the system to operate in the programmed temperature range, and to dispose auxiliary temperature regulating device in the system for the pump (106) to operate and reach programmed time and temperature yet still not operating in the programmed range to activate auxiliary temperature regulating device (109), and to control auxiliary temperature regulating device (109) as auxiliary temperature regulation; and to control system to reduce load or cut off power when system temperature is abnormal;

support (600); comprising one of more than one pillar or frame structure, the low end disposed with heat equalizer (102) in natural heat carrier (101), the heat equalizer (102) can be disposed with heat conduction wing (601) to increase heat conduction effect, the support (600) is disposed with the semiconductor application installation (1032) comprising photovoltaic generation device with heat dissipation structure at the back and part of all unit devices including controlling unit (110), pump (106), temperature detector device (107), filter (108), wherein the semiconductor application installation (1032) comprising photovoltaic generation device with heat dissipation structure at the back is optionally disposed with support (600), or additional auxiliary supporting arm (1100), or as illustrated in FIG. 10 additional auxiliary supporting arm (1100) of light source tracking device (1200) is disposed; above stated the semiconductor application installation (1032) comprising photovoltaic generation device with heat dissipation structure at the back disposed at the support (600) has fluid transmission duct, and the inlet and outlet of the fluid is for connecting to fluid transmission duct (105) for leading to heat equalizer (102) to form closed flow path; internal of fluid transmission duct (105) is for flowing fluid (104); fluid (104) executes circulation from fluid temperature fluctuation effect, or executes pumping from additional pump (106) in order for the fluid (104) to execute temperature equalizing transmission between heat equalizer (102) and semiconductor application installation (1032) comprising photovoltaic generation device with heat dissipation structure at the back;

heat insulating material (700): relates to all kinds of heat insulating material for disposing between the support (600) with exposed natural heat carrier (101) and the internal of fluid transmission duct (105) in order to provide heat insulation effect to the outside world and reduce heat energy from escaping; such heat insulating material (700) is optionally disposed according to the need; the insulating material also can be replaced by extracting air to achieve vacuum effect, and the support (600) is made of material with better heat insulating material, or not disposed if the fluid transmission duct (105) is made of structure with heat insulating material;

heat conductor (800): relates to material made of heat conducting material for the support (600) to dispose between the inside of the root duct of natural heat carrier (101) and the fluid transmission duct (105) to facilitate the temperature equalizing effect of fluid (104) of fluid transmission duct (105) through heat equalizer (102) and natural temperature carrier (101); heat conductor is also made from one body structure for the heat equalizer (102);

FIG. 11 is a schematic view of embodiment of the present invention in the application of photovoltaic generation device disposed with energy storage installation, which relates to the temperature of natural heat carrier (101) consist of solid state or liquid state natural heat carrier including stratum, surface of earth, pond, lake, river, desert, iceberg, or ocean where presents comparatively larger and more reliable heat carrying capacity, in order to execute temperature equalization to the heat generated by semiconductor application installation (1032) comprising photovoltaic generation device with heat dissipation structure at the back and/or electrical energy storage device (900) consists of photovoltaic generation device (1000), where the main structure is disposed with at least a fluid transmission duct (105) for pumping by pump (106), or driven by the convection effect of fluid heat fluctuation, for the fluid to flow through semiconductor application installation (1032) comprising photovoltaic generation device with heat dissipation structure at the back and/or electrical energy storage device (900), and through fluid transmission duct (105) in order to flow back to heat equalizer (102) disposed in natural heat carrier (101) and constitute circulation of fluid; its main structure comprising:

the heat equalizer (102): relates to one made of a material with good heat conduction performance and constructed in a way to provide good heat conduction with the natural heat carrier (101); the heat equalizer (102) is provided with a fluid inlet, a fluid outlet, and an internal fluid passage; or the space in the natural heat carrier (101) allowing the fluid to flow forthwith constitutes a heat carrier for heat accumulation to replace the heat equalizer (102), made of a material with good heat conduction performance; or both of the heat equalizer (102) and the space in the natural heat carrier (101) are provided at the same time; the heat equalizer can also be the duct of natural heat capacity (101) by burying the support (600); comprising one or more than one heat equalizers (102) undertaking temperature equalization to the semiconductor application installation adapted with a temperature equalization system comprised of semiconductor application installation (1032) comprising photovoltaic generation device with heat dissipation structure at the back and/or electrical energy storage device (900); or one heat equalizer (102) undertaking temperature equalization to one or more than one independently disposed semiconductor application installation adapted with a temperature equalization system comprised of semiconductor application installation (1032) comprising photovoltaic generation device with heat dissipation structure at the back and/or electrical energy storage device (900); or two or more than two heat equalizers (102) undertaking temperature equalization to two or more than two independently disposed semiconductor application installation adapted with a temperature equalization system comprised of semiconductor application installation (1032) comprising photovoltaic generation device with heat dissipation structure at the back and/or electrical energy storage device (900).

semiconductor application installation (1032) comprising photovoltaic generation device with heat dissipation structure at the back: relates to the back side disposes photovoltaic device (1000) with heat dissipation structure from glass substrate or carrier of photovoltaic semiconductor and disposed with fluid transmission duct, for providing transmission of electricity generated under the light to electrical energy storage device (900) before output of electricity;

electrical energy storage device (900): comprising of all kinds of rechargeable secondary battery or capacitor or supercapacitor, for storing the electrical power generated by the semiconductor application installation (1032) comprising photovoltaic generation device with heat dissipation structure at the back and for output to external world; the electrical energy storage device (900) can be disposed with temperature detection device (107) and fluid transmission duct (105) depending on the need;

Electrical adjusting device (1005): comprising of dynamo or solid state semiconductor circuit component or integrated circuit, for adjusting output voltage of photovoltaic generation device (1000);

the fluid (104): relates to a gas or a liquid provided to execute the function of heat transmission in the system; the fluid is pumped by the pump (106) to flow through the heat equalizer (102) disposed in the natural heat carrier (101) and/or the fluid transmission duct (105) and/or semiconductor application installation (1032) comprising photovoltaic generation device with heat dissipation structure at the back, and flows back through the fluid transmission duct (105) to the heat equalizer (102) to complete the circulation for the operation to provide temperature equalization; or to complete the circulation by fluid temperature fluctuation effect for execution of temperature equalization function;

the fluid transmission duct (105): relates to a duct structure provided at where between the heat equalizer (102) and semiconductor application installation (1032) comprising photovoltaic generation device with heat dissipation structure at the back and for connected in series with the pump (106) for the fluid (104) to circulate; to facilitate maintenance, an optional device with structure to open or to draw can be provided to the fluid transmission duct (105) as applicable;

the pump (106): relates to a fluid pump driven by electric power generated by photovoltaic generation device (1000) or electric power of connected electricity storage device or other electric power, or mechanical force, or manpower, or any other natural force, connected in series with the fluid transmission duct (105), and subject to the control by a control unit (110) to pump the fluid (104); this pumping function can be submitted by the convection effects of the temperature fluctuation of the fluid;

a temperature detector device (107): an optional item related to analog or digital dynamo-electric or solid state electronic device of the prior art disposed in semiconductor application installation (1032) comprising photovoltaic generation device with heat dissipation structure at the back and/or electrical energy storage device (900) to indicate the temperature, or provide signal feedback to the control unit (110) and/or electrical adjusting device (1005) and through operating or stopping control pump (106) for system to operate in programmed temperature range, and auxiliary temperature regulating device (109) disposed in the system and activating auxiliary temperature regulating device (109) when pump (106) operating to reach programmed time and temperature yet still unable to operate in the programmed range;

a filter (108): relates to an optional item provided at the fluid suction inlet or outlet of each device mounted to the fluid circulation loop, or at a selected location in the fluid transmission duct (105) to filter fluid foreign material and prevent the duct from getting plugged and assurance of clean fluid;

an auxiliary temperature regulation device (109): an optional item related to dynamo-electric solid, gas or liquid state temperature regulation device to heat or cool the fluid (104), or a power heating or cooling device comprised of solid state or semiconductor, as subject to the control by the control unit (110) to activate auxiliary temperature regulating device (109) when system temperature drifting programmed range, to be activated to regulate the heating or cooling temperature control to the heating or cooling position of fluid (104) when the temperature in the device floats away from the range set; and the control unit (110): comprised of dynamo-electric or solid state electronic circuit and related software to control fluid pump (106) for pumping one-way continuous or intermittent fluid (104) depending on the temperature detection signal and system temperature setting of the temperature detection device (107), and to control the direction and flow rate of the fluid (104) between the heat equalizer (102) and/or the semiconductor application installation (1032) and/or electrical energy storage device (900) comprising photovoltaic generation device with heat dissipation structure at the back; and to control or stop the pump (106) for the system to operate in the programmed temperature range, and to dispose auxiliary temperature regulating device in the system for the pump (106) to operate and reach programmed time and temperature yet still not operating in the programmed range to activate auxiliary temperature regulating device (109), and to control auxiliary temperature regulating device (109) as auxiliary temperature regulation; and to control system to reduce load or cut off power when system temperature is abnormal;

support (600); comprising one of more than one pillar or frame structure, the low end disposed with heat equalizer (102) in natural heat carrier (101), the heat equalizing device (102) can be disposed with heat conduction wing (601) to increase heat conduction effect, the support (600) is disposed with the semiconductor application installation (1032) comprising photovoltaic generation device with heat dissipation structure at the back and electrical energy storage device (900) and part of all unit devices including controlling unit (110), pump (106), temperature detector device (107), filter (108), wherein the semiconductor application installation (1032) comprising photovoltaic generation device with heat dissipation structure at the back and electrical energy storage device (900) is optionally disposed with support (600), or additional auxiliary supporting arm (1100), or as illustrated in FIG. 12 additional auxiliary supporting arm (1100) of light source tracking device (1200) is disposed; above stated the semiconductor application installation (1032) and/or electrical energy storage device (900) comprising photovoltaic generation device with heat dissipation structure at the back disposed at the support (600) has fluid transmission duct, and the inlet and outlet of the fluid is for connecting to fluid transmission duct (105) for leading to heat equalizer (102) to form closed flow path; internal of fluid transmission duct (105) is for flowing fluid (104); fluid (104) executes circulation from fluid temperature fluctuation effect, or executes pumping from additional pump (106) in order for the fluid (104) to execute temperature equalizing transmission between heat equalizer (102) and semiconductor application installation (1032) comprising photovoltaic generation device with heat dissipation structure at the back and/or electrical energy storage device (900);

heat insulating material (700): relates to all kinds of heat insulating material for disposing between the support (600) with exposed natural heat carrier (101) and the internal of fluid transmission duct (105) in order to provide heat insulation effect to the outside world and reduce heat energy from escaping; such heat insulating material (700) is optionally disposed according to the need; the insulating material also can be replaced by extracting air to achieve vacuum effect, and the support (600) is made of material with better heat insulating material, or not disposed if the fluid transmission duct (105) is made of structure with heat insulating material;

heat conductor (800): relates to material made of heat conducting material for the support (600) to dispose between the inside of the root duct of natural heat carrier (101) and the fluid transmission duct (105) to facilitate the temperature equalizing effect of fluid (104) of fluid transmission duct (105) through heat equalizer (102) and natural temperature carrier (101); heat conductor is also made from one body structure for the heat equalizer (102);

The semiconductor application installation adapted with a temperature equalization system, its support (600) can also be comprised of one or more than one pillar of the support of U-shape duct, the top of the U-shape duct is for connecting to the rack structure disposed at the top as illustrated in FIGS. 5, 6, 7, 8, 9, 10, 11, and 12 for disposing related semiconductor application installation, related control circuit device, the fluid duct at the top of U-shape duct is for connecting to fluid transmission duct (105) disposed on the semiconductor application installation or of the electrical energy storage device (900) in order to form a closed fluid path for passing fluid in order to transmit temperature energy between heat equalizer (102), and further optionally dispose pump filter device, and light source tracking mechanism (1200), etc. depending on the function of the dispose semiconductor application installation.

Figure 13:
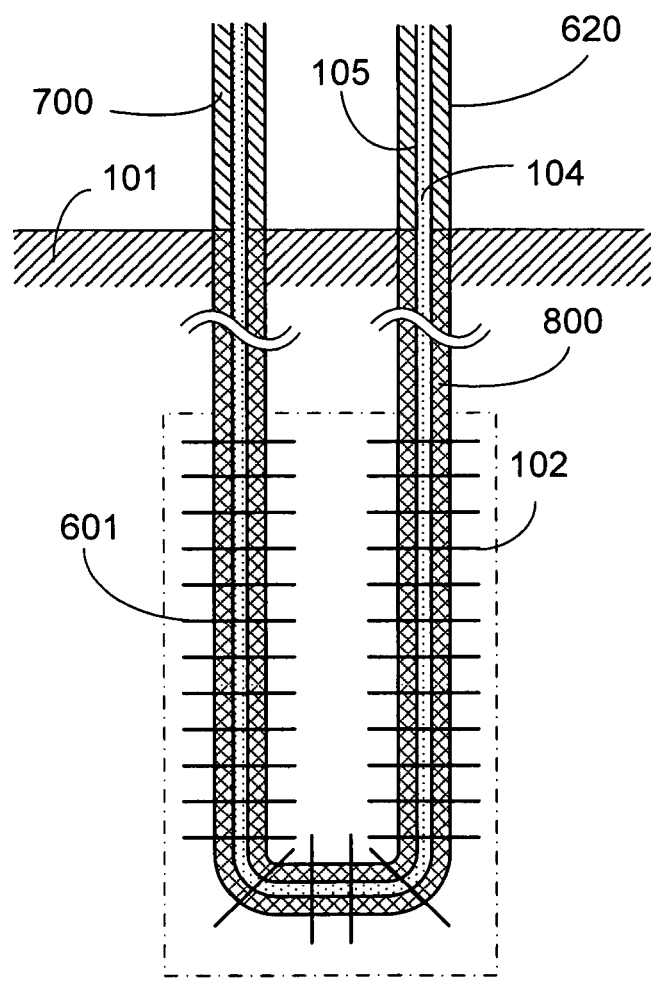
FIG. 13 is a schematic view of the embodiment of the present invention showing a U-shape duct consists of a pillar disposed with internal fluid duct and heat equalizer (102).
Figure 14:
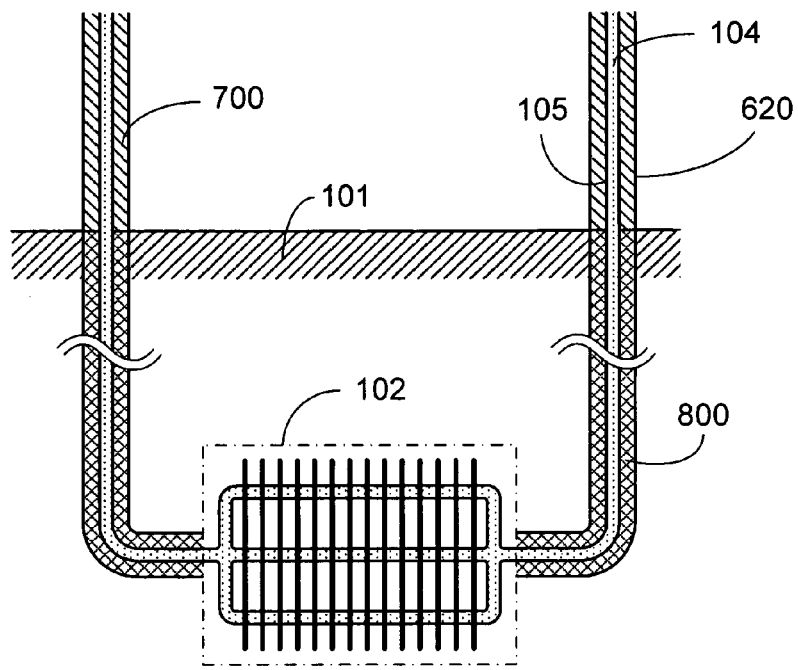
FIG. 14 is a schematic view of the embodiment of the present invention consists of a U-shape duct disposed with another heat equalizer (102) disposed in the natural heat carrier (101) for connecting to the fluid transmission duct (105) inside the U-shape duct.
Figure 15:
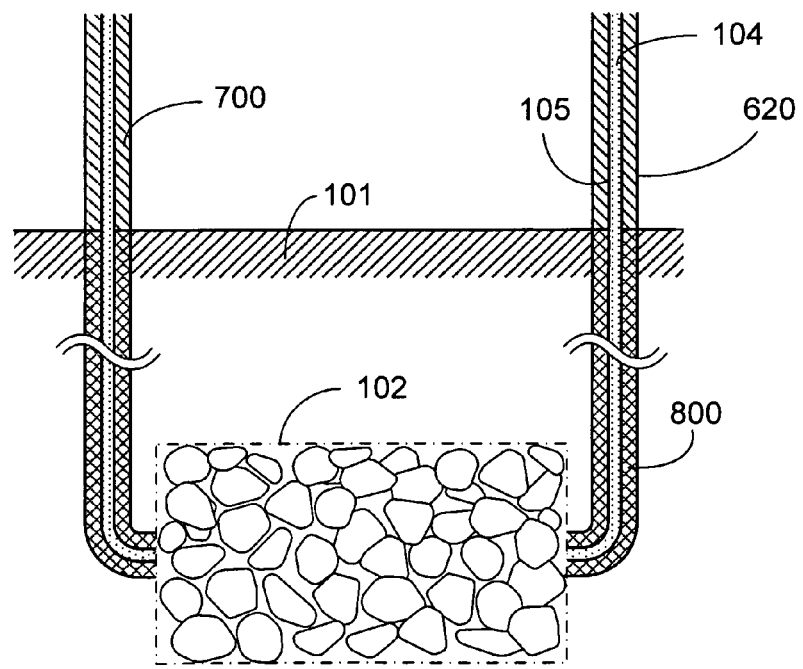
FIG. 15 is a schematic view of the embodiment of the present invention showing a U-shape duct consists of a pillar disposed with internal fluid duct and internal of natural heat carrier (101) with space for fluid to flow.

The U-shape tube consists of heat insulation material, or coated heat insulation material, or tube coated with heat insulation material, or outer tube (620) with larger diameter forming support (600) structure, the internal is penetrated with internal fluid transmission duct (105) of smaller diameter for fluid to pass through, the U-shape duct exposes the part above natural heat carrier (101), the exterior of its outer duct (620) is for wrapping heat insulation material, the space between the inner wall of the outer duct (620) and interior of fluid transmission duct (105) is for filling of heat insulation material (700), the top of U-shape duct is for connecting to the support structure disposed at the top as illustrated in FIGS. 5, 6, 7, 8, 9, 10, 11, and 12, the U-shape duct itself is the structure for fluid duct function, its method of construction includes one or more than one kind listed below, comprising:

(1) the duct disposed in natural heat carrier (101) consists of material with good conduction feature, and forms heat equalization function structure with natural heat carrier (101), and disposes heat conductor (800) between the outer duct (620) disposed into the part of natural heat carrier (101) and the interior of fluid transmission duct; (as the embodiment illustrated in FIG. 13 showing U-shape duct consists of a supporting pillar disposed with internal fluid duct and heat equalizer (102)); or (2) another heat equalizer (102) disposed in natural heat carrier (101), wherein the heat equalizer (102) is disposed with fluid inlet and fluid outlet, connecting respectively to the fluid transmission duct (105) disposed inside the U-shape duct to form fluid circulation path, the inside of the heat equalizer (102) is disposed with fluid duct, the heat equalizer (102) is optionally disposed with heat conduction wing (601) for increasing heat equalization effect; (as the embodiment illustrated in FIG. 14 showing the U-shape duct disposed with another heat equalizer (102) disposed in the natural heat carrier (101) for connecting to the fluid transmission duct (105) inside the U-shape duct); or (3) the space for fluid to pass through outer duct connecting directly to natural heat carrier (101), in order to form heat storage function of heat equalizer (102) directly with the space of natural heat carrier, and to replace the heat equalizer (102) made of good heat conduction material; (as the embodiment illustrated in FIG. 15 showing a U-shape duct consists of a supporting pillar disposed with internal fluid duct and internal of the natural heat carrier (101) with space for fluid to flow).

Above stated U-shape duct interior is disposed with fluid transmission duct (105) passing through the heat equalizer (102) disposed in natural heat carrier (101), the top is disposed with fluid inlet, the fluid outlet through fluid transmission duct (105) disposed outside for connecting to disposed gas state or liquid state semiconductor application installation or fluid transmission duct (105) of optionally disposed electrical energy storage device (900), and for undertaking heat circulation through natural circulation of heat fluctuation or disposed pump (106).

Figure 16:
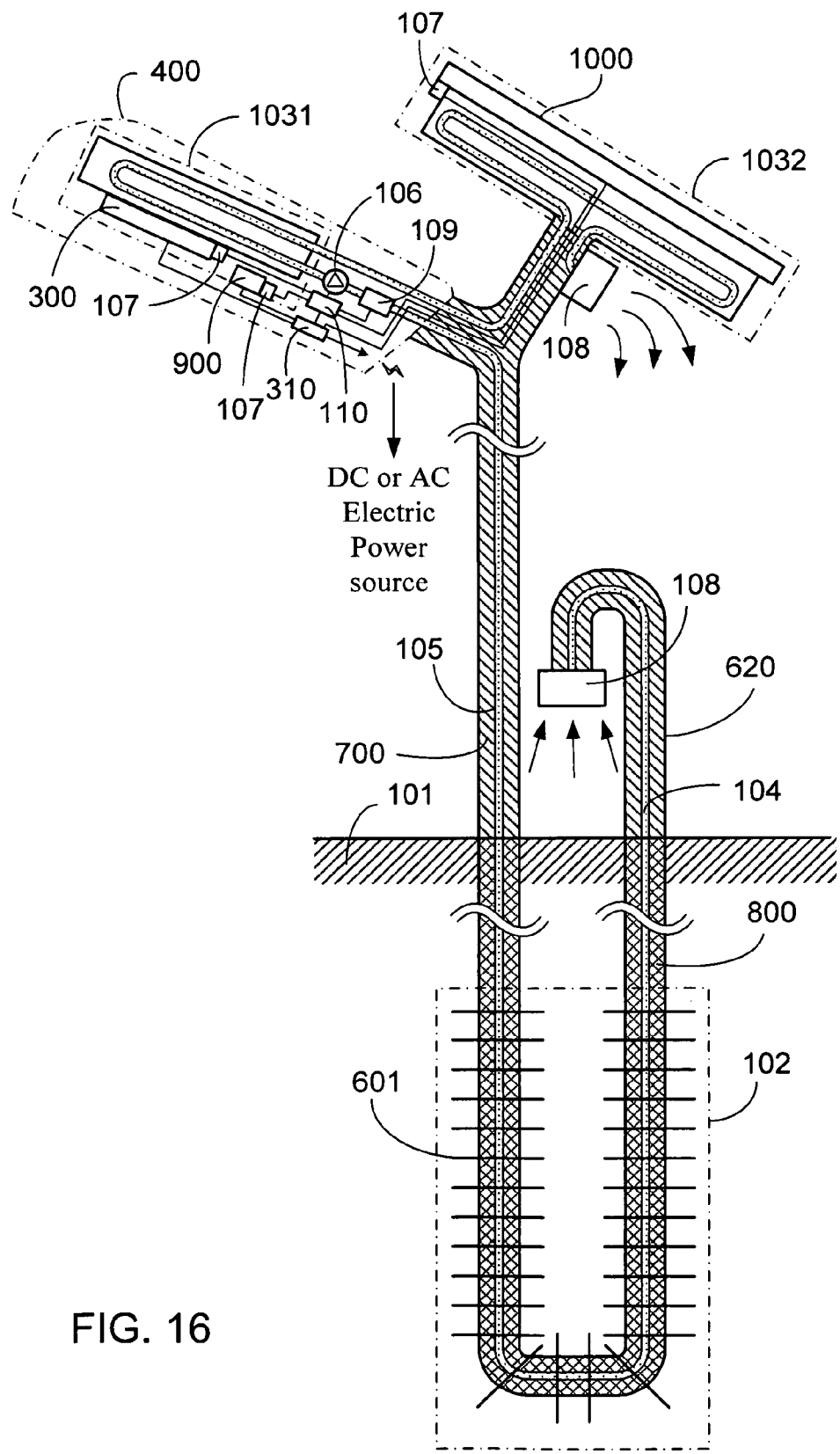
FIG. 16 is the first schematic view of the embodiment of the present invention showing open fluid temperature equalizing circulation structure.
Figure 17:
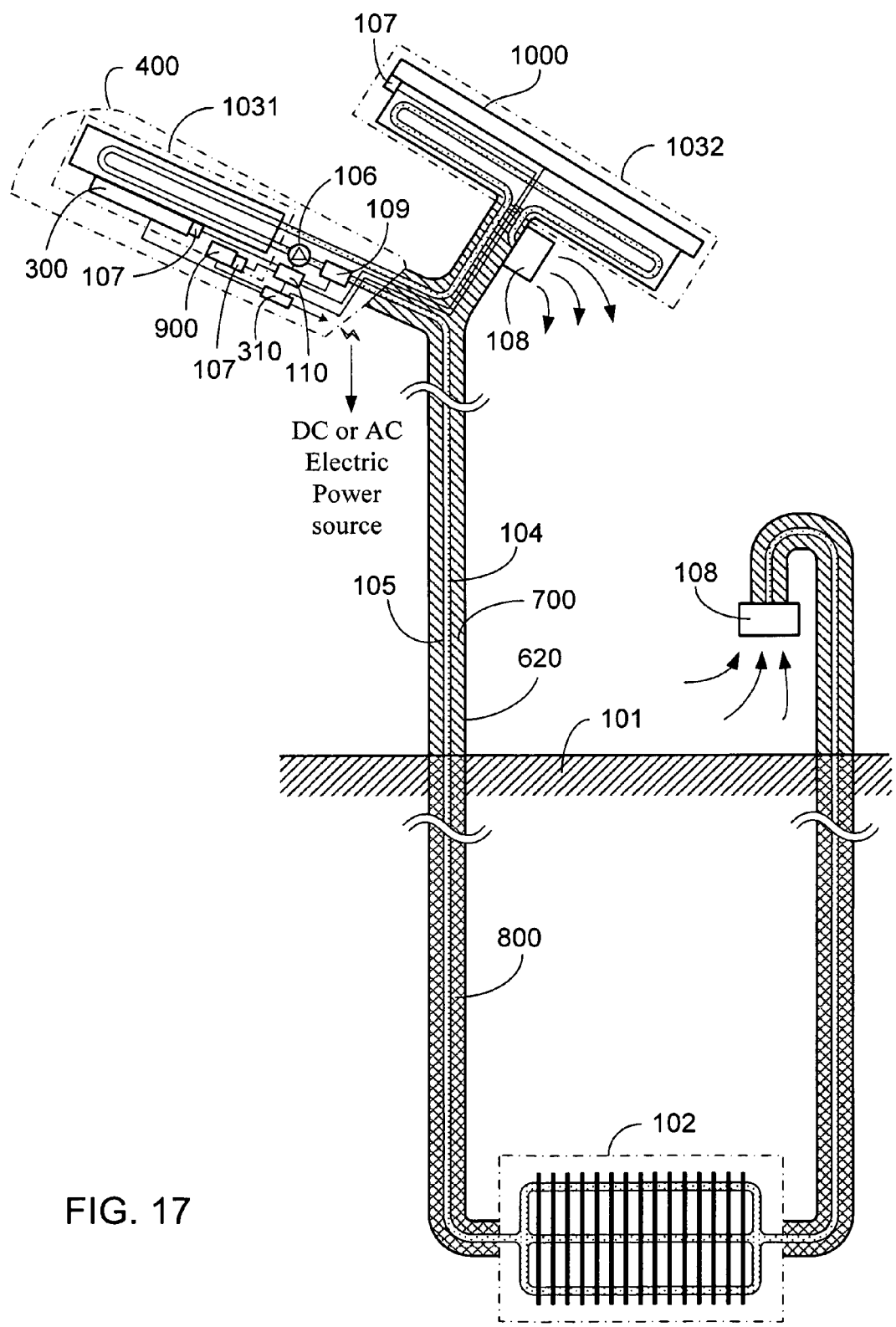
FIG. 17 is the second schematic view of the embodiment of the present invention showing open fluid heat equalization circulation structure.

This semiconductor application installation adapted with a temperature equalization system can also adopt open fluid temperature circulation structure, wherein external fluid flowing through filter (108) before entering the heat equalizer (102) disposed in the natural heat carrier (101), and through the fluid transmission duct (105) disposed on the support (600) passing through the LED with heat dissipation structure at the back or semiconductor application installation (1031) with gas state lamp structure of LED or gas state lamp (300), and/or semiconductor application installation (1032) comprising photovoltaic generation device with heat dissipation structure at the back of photovoltaic generation device (1000) of photovoltaic energy, and/or electrical energy storage device (900) before passing through filter (108) or passing through net shape mask discharging fluid externally, or discharges directly, including the illustration in FIG. 16 that is the first schematic view of the embodiment of the present invention showing open fluid temperature equalizing circulation structure; wherein the duct disposed inside the natural heat carrier (101) is material of good conduction feature, and the natural heat carrier (101) having good heat conduction structure to form heat equalization function, and disposes heat conductor (800) between the part of the outer duct (620) disposed into natural heat carrier (101) and the internal fluid transmission duct;

FIG. 17 is the second illustration of the open fluid heat equalization circuit structure of the present invention, wherein the other heat equalizer (102) is disposed in the natural heat carrier (101), the heat equalizer (102) is disposed with fluid inlet and fluid outlet, for connecting to fluid transmission duct (105) disposed inside the U-shape duct to form fluid circulation, the internal of heat equalizer (102) is disposed with fluid duct, the heat equalizer (102) is optionally disposed with heat conduction wing (601) to increase heat equalization effect.

Figure 18:
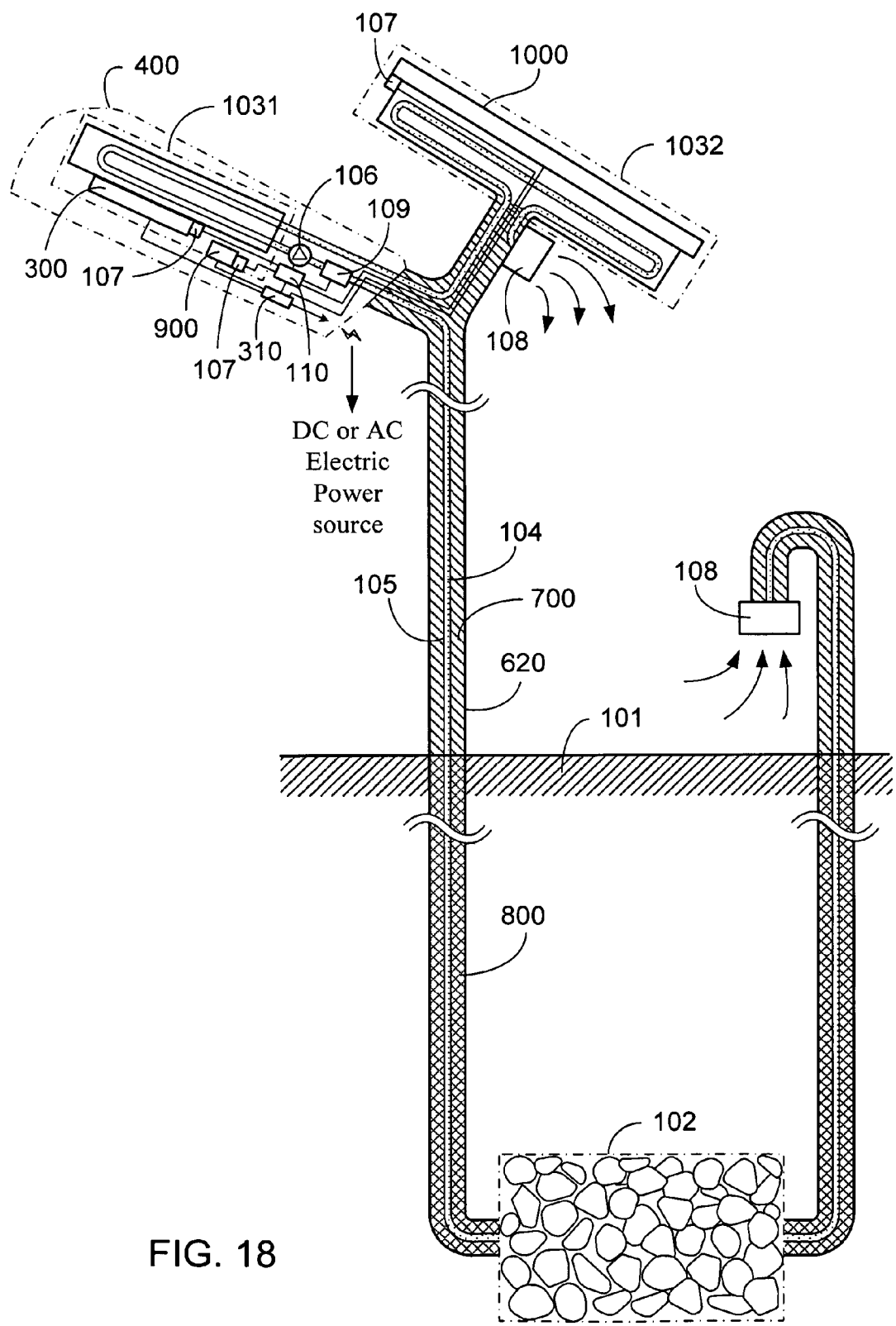
FIG. 18 is the third schematic view of the embodiment of the present invention showing open fluid heat equalization circulation structure.

FIG. 18 is the third illustration of the open fluid heat equalization circuit structure of the present invention, wherein space for the fluid to flow through the outer duct to connect directly to internal of natural heat carrier (101), in order to form the heat storage function directly for the space of the natural heat carrier (101), and to replace the heat equalizer (102) made of material with good thermal conductivity.

As is summarized from above descriptions, the semiconductor application installation adapted with a temperature equalization system by means of a natural heat carrier of the present invention by operating on the long-term reliable thermal energy from heat carriers in the nature with the fluid (104) flowing through the heat equalizer (102) mounted in the natural heat carrier to carry the thermal energy to achieve the purpose of heat equalization as the fluid (104) flows through the disposed LED with heat dissipation structure at the back or semiconductor application installation (1031) with gas state lamp structure of LED or gas state lamp (300), and/or semiconductor application installation (1032) comprising photovoltaic generation device with heat dissipation structure at the back of photovoltaic generation device (1000) and/or electrical energy storage device (900), which requires less energy source in the temperature regulation and control than that by the conventional air conditioning system.

The invention claimed is:

1. A temperature equalization system for a semiconductor application installation (103), wherein the semiconductor application installation (103) is one of a light emitting diode (LED) with a heat dissipation structure, a gas state lamp structure (1031), and a photovoltaic device (1032) with a heat dissipation structure, said temperature equalization system comprising:
 a first heat equalizer (102) made of a thermally conductive material in thermal contact with a natural heat carrier (101), the first heat equalizer (102) having a fluid inlet, a fluid outlet, and at least one of an internal fluid passage and a space in the natural heat carrier for carrying a first fluid (204);
 a first fluid transmission duct (205) for carrying the first fluid (204) from the heat equalizer (102) to a location near the semiconductor application installation (103);
 a first pump (206) for pumping the first fluid (204) through the first fluid transmission duct (205);
 a second fluid transmission duct (105) for carrying a second fluid (104) past the heat dissipation structure of the LED or photovoltaic device (1032), or past the gas state lamp structure (1031), to provide temperature equalization;
 a second pump (106) for pumping the second fluid (104) through the second fluid transmission duct (105);
 a control unit (110) for controlling operation of the second pump (106) to cause a temperature of the semiconductor application installation (103) to be within a programmed temperature range in response to feedback from a temperature detector device (107) that monitors a temperature of the semiconductor application installation (103); and
 a relay heat equalizer (202) extending between the first fluid transmission duct (205) and the second fluid transmission duct (105) for transferring heat between the first fluid (204) and the second fluid (104).

2. A temperature equalization system for a semiconductor application installation (103) as claimed in claim 1, wherein the semiconductor application installation (103) further includes a bypass duct (119), a bypass control valve (120), and bypass auxiliary pump (121) for selectively causing the second fluid (104) to flow through an individual part of the semiconductor application installation (103) and then back to the relay heat equalizer (202).

3. A temperature equalization system for a semiconductor application installation (103) as claimed in claim 1, wherein the fluid (104) is one of a gas and a liquid.

4. A temperature equalization system for a semiconductor application installation (103) as claimed in claim 1, wherein the first fluid transmission duct (205) is thermally insulated.

5. A temperature equalization system for a semiconductor application installation (103) as claimed in claim 1, further comprising an auxiliary temperature regulating device (109) for heating or cooling the second fluid (104) in response to feedback from the temperature detector device (107) for providing auxiliary temperature equalization after activation of said second pump (106) and before the temperature of said semiconductor application installation (103) is within said programmed temperature range.

6. A temperature equalization system for a semiconductor application installation (103) as claimed in claim 1, further comprising a filter (108) provided at the fluid inlet or fluid outlet for preventing the second fluid transmission duct (105) from being plugged by foreign material.

7. A temperature equalization system for a semiconductor application installation (103) as claimed in claim 1, wherein the relay heat equalizer (202) includes a first fluid passage having an inlet, flowing passage, and outlet for the second fluid (104), and a second fluid passage having an inlet, flowing passage, and outlet for the first fluid (204).

8. A temperature equalization system for a semiconductor application installation (103) as claimed in claim 1, wherein the control unit (110) further controls the first pump (206) to pump said first fluid (204) between the first heat equalizer (102) and the relay heat equalizer (202).

9. A temperature equalization system for a semiconductor application installation (103) as claimed in claim 1, wherein the natural heat carrier (101) consists of a solid or liquid heat carrier including at least one of an earth stratum, surface of the earth, pond, lake, river, desert, iceberg, and ocean.

10. A temperature equalization system for a semiconductor application installation (103) as claimed in claim 1, wherein pumping by said first pump (206) or second pump (106) is assisted by convection effects.

11. A temperature equalization system for a semiconductor application installation (103) as claimed in claim 1, wherein at least one of said first pump (206) and said second pump (106) has a reversible direction, and said control unit (110) controls a flow direction at which the fluids (204) and 104) are respectively pumped by the first pump (206) and second pump (106).

12. A temperature equalization system for a semiconductor application installation (103) as claimed in claim 1, wherein at least one of said first pump (206) and said second pump (106) is controlled to execute at least one of the following modes:
   a. only one of said first and second pumps executes one-way continuous pumping,
   b. only one of said first and second pumps executes one-way intermittent pumping,
   c. only one of said first and second pumps executes one-way pumping to periodically change a flow direction of the respective one of said first and second fluids that is pumped through the respective first pump or second pump, by controlling a value allowing variable flow direction,
   d. at least both of said first and second pumps having different power sources execute pumping in different directions at a same time, or separately execute pumping in periodically changed flow directions,
   e. at least both of said first and second pumps having different flow directions are driven at the same time to execute continuous pumping in the different flow directions, or to further execute periodical change in flow direction of the respective one of the first and second fluids that is being pumped; and
   f. at least one of the first and second pumps in a two-way pump arranged to alternatively execute pumping in different directions to periodically change the flow directions by changing a revolving direction of a power source.

13. A temperature equalization system for a semiconductor application installation (103) as claimed in claim 1, wherein the first fluid transmission duct (205) has a curved, labyrinth, or vortex form and is buried in the natural heat carrier (101) to form said first heat equalizer (102).

14. A temperature equalization system for a semiconductor application installation (103) as claimed in claim 1, further comprising a bypass control value (120) for controlling a flow rate of at least one of said first and second fluids.

15. A temperature equalization system for a semiconductor application installation (103) as claimed in claim 1, further comprising a driving control circuit (310) for controlling a supply of electrical energy to said LED, gas state lamp structure (1031), or photovoltaic device (1032).

16. A temperature equalization system for a semiconductor application installation (103) as claimed in claim 1, further comprising a support (600) having a lower end at which said first heat equalizer (102) is disposed and from which extends a thermal conduction wing (601) for providing increase heat conduction.

* * * * *